(12) United States Patent
Luk

(10) Patent No.: US 7,230,455 B2
(45) Date of Patent: Jun. 12, 2007

(54) LOGIC CIRCUITS UTILIZING GATED DIODE SENSING

(75) Inventor: Wing Kin Luk, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 185 days.

(21) Appl. No.: 11/067,825

(22) Filed: Feb. 28, 2005

(65) Prior Publication Data

US 2006/0192591 A1    Aug. 31, 2006

(51) Int. Cl.
*H03K 19/20* (2006.01)
(52) U.S. Cl. ........................................ 326/119; 326/26
(58) Field of Classification Search ................ 326/112, 326/119, 118, 121, 26, 27
See application file for complete search history.

(56) References Cited

U.S. PATENT DOCUMENTS 6,104,045 A * 8/2000 Forbes et al. ................ 257/141
7,136,296 B2 * 11/2006 Luk et al. .................... 365/154

* cited by examiner

*Primary Examiner*—Don Le
(74) *Attorney, Agent, or Firm*—Ryan, Mason & Lewis, LLP

(57) ABSTRACT

A family of logic circuits, called gated diode logic circuits, is disclosed wherein small amplitude signals, typically a fraction of the supply voltage, can be sensed and amplified by applying a small amplitude signal to a gate of a gated diode in a sampling mode and changing a voltage of a source of the gated diode in an evaluation mode. One or more isolation devices may be connected between each small amplitude signal and a gate of the gated diode, wherein the isolation device passes the small amplitude signal to the gate of the gated diode in the sampling mode, and isolates the small amplitude signal from the gate in the evaluation mode for amplification and performing fast logic operations (logic functions). The disclosed gated diode logic circuits overcome the $V_t$ variation problem in FETs by detecting and amplifying the small logic signals utilizing gated diodes that have relatively low $V_t$ variation. The amplified signals may then be processed by conventional logic circuits to perform certain logic functions in a gated diode logic circuit. The $V_t$ variation of the gated diode is relatively small compared to the small logic signal amplitude and can be controlled relatively precisely. Typically, $V_t$ of the gated diode can be set to a fraction of the small logic signal amplitude. Thus, in a gated diode logic circuit, the gated diode circuit can sense and amplify the small logic signals sufficiently to perform the various logic operations in conjunction with conventional logic circuits. The output(s) of the gated diode logic circuit can be of a standard full CMOS voltage swing, or can be scaled down in amplitude and further processed by other gated diode logic circuits.

20 Claims, 17 Drawing Sheets p-WELL DOPANT CONCENTRATION CONTROLS GATED DIODE Vt p-WELL DOPANT CONCENTRATION CONTROLS GATED DIODE Vt

—— LOGIC 1
- - - - LOGIC 0

1-DATA
1300

0-DATA
1350

LOGIC CIRCUITS UTILIZING GATED DIODE SENSING

FIELD OF THE INVENTION

The present invention relates to logic circuits and, more particularly, to logic circuits that utilize gated diodes for sensing and performing logic operations on small amplitude signals.

BACKGROUND OF THE INVENTION

Logic circuits are constantly evolving toward higher densities and higher speeds. To accomplish this, small amplitude signals are being used more frequently to transport data over wide data buses that are internal or external to a semiconductor chip. The small signal transmission is used because the switching power is proportional to $CV^2f$ where C is the load capacitance, V is the voltage, and f is the frequency of the switching. The frequency used for switching on data buses has been constantly increasing to accommodate more data per unit time and the logic voltages have been decreasing to conserve power. Small amplitude signals which can significantly reduce switching power, however, require small signal detection and amplification at the receiving end to differentiate logic levels.

The small amplitude signals, or simply small logic signals, or small signals, typically have amplitudes that are 10-20% of the supply voltage ($V_{DD}$) of a given technology. The threshold voltage ($V_t$) variation (e.g., 10-20% of $V_{DD}$) in the Field-Effect Transistors (FETs) utilized in conventional logic circuits, however, is comparable to the small logic signal amplitude. Logic circuits based on traditional Field-Effect Transistor designs are therefore not able to accurately sense and perform logic operations on small logic signals. This is true for both current and future generations of integrated circuit technologies and, thus, conventional FET logic circuits are not able to handle small logic signals. To overcome the limitation due to the relatively small difference in amplitude between logic levels, small signal sensing circuits must be used in conjunction with logic circuits so that the small logic signals can be detected precisely. For example, when voltages under one volt are being used as the high logic level for small amplitude signals, traditional logic circuits are often unable to reliably detect the signal's high logic level without the use of small signal sensing circuits.

Many circuits for memory and data transmission require sense amplifiers for the detection of single ended small signals, and amplification to the full supply voltage level (VDD). Differential sense amplifiers for complementary signal sensing have been widely adopted as they have high signal-to-noise (S/N) margin and high rejection for common mode noise. Single ended sense amplifiers for small signals remain a challenge as the reference voltage point used to separate the 0- and 1-state of the small signal may vary as much as the small signal itself, due to variations in the manufacturing process, device threshold voltage, and temperature. Many signal sources are single ended, such as a DRAM cell, but have been configured with balanced differential signal lines for sensing for the above reason. As FET's are scaled down further (to 65 nm and beyond), the variation of transistor threshold voltage between nearby devices due to statistical fluctuation will be greater and the advantage of differential sensing will be reduced.

A need therefore exists for small signal sensing circuits that can be used in conjunction with conventional logic circuits to process and perform logic operations on small amplitude signals.

SUMMARY OF THE INVENTION

A family of logic circuits, called gated diode logic circuits, is disclosed wherein small amplitude signals can be sensed and amplified by applying a small amplitude signal to a gate of a gated diode in a sampling mode and changing a voltage of a source of the gated diode in an evaluation mode. One or more isolation devices may be connected between each small amplitude signal and a gate of the gated diode, wherein the isolation device passes the small amplitude signal to the gate in the sampling mode and isolates the small amplitude signal from the gate in the evaluation mode.

The disclosed gated diode logic circuits overcome the $V_t$ variation problem in FETs by detecting and amplifying the small logic signals utilizing gated diodes that have very low $V_t$ variation. The amplified signals may then be processed by conventional logic circuits. The $V_t$ variation of the gated diode is relatively small compared to the small logic signal amplitude and can be controlled relatively precisely. Typically, $V_t$ of the gated diode can be set to half that of the small logic signal amplitude. Thus, the gated diode circuit can sense and amplify the small logic signals sufficiently to perform the various logic operations in conjunction with conventional logic circuits. The output of the logic circuit can be of a standard full CMOS voltage swing, or can be scaled down in amplitude.

A more complete understanding of the present invention, as well as further features and advantages of the present invention, will be obtained by reference to the following detailed description and drawings.

DETAILED DESCRIPTION

U.S. patent application Ser. No. 10/751,714, entitled "Amplifiers Using Gated Diodes," incorporated by reference herein, describes an exemplary amplifier circuit for signal amplification and single ended small signal sensing based on gated diode circuitry. The gated diode amplifiers have the unique characteristic of providing high gain and high signal margin, and are tolerant of supply voltage, threshold voltage and process variation. Details about the gated diode characteristic, the principle of operation of the gated diode and the gated diode amplifier are described in the above-identified patent application.

Figure 1A:
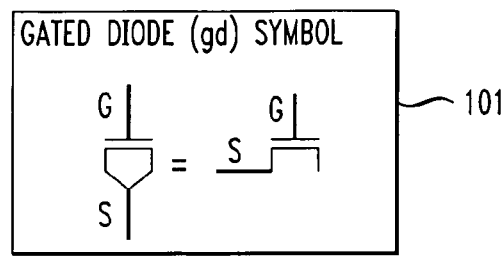
FIG. 1A shows equivalent symbols for a gated diode.
Figure 1B:
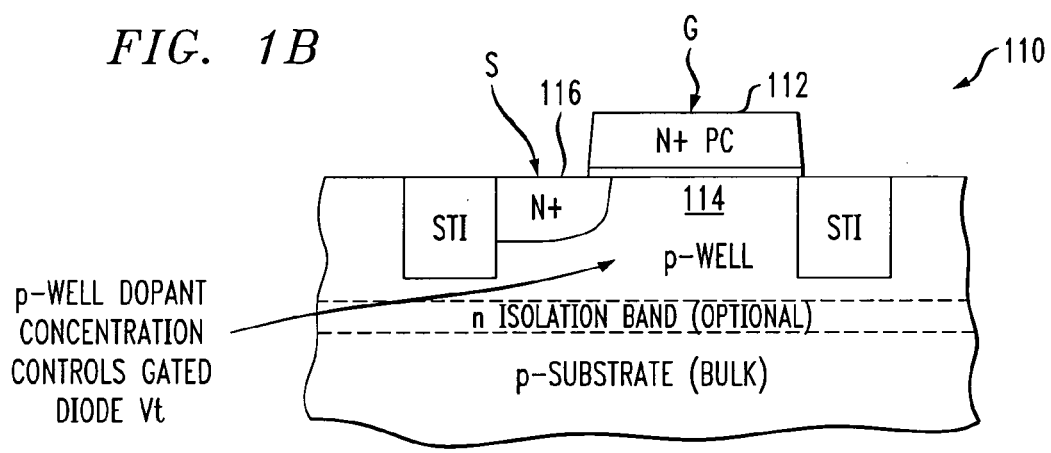
FIG. 1B shows a diagram of a gated diode structure in bulk silicon.
Figure 1C:
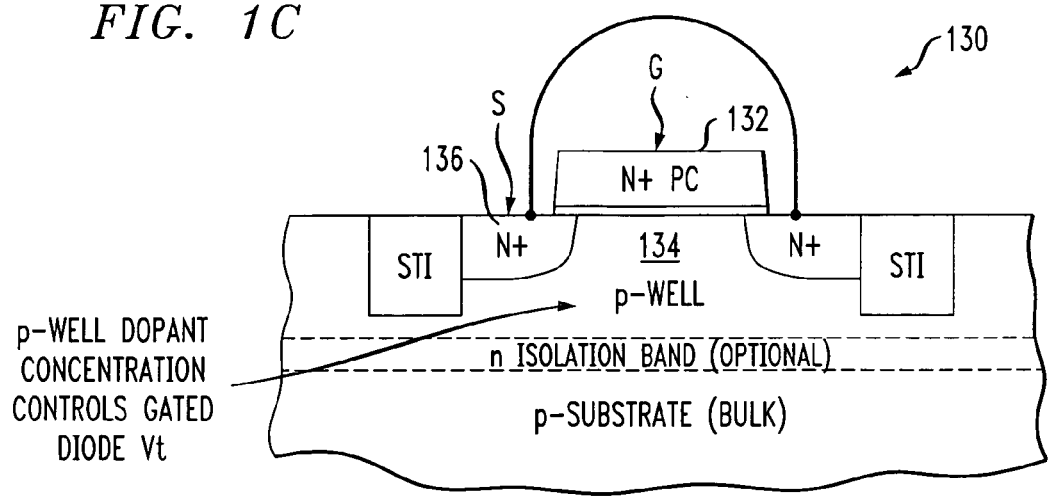
FIG. 1C shows an alternative embodiment of the gated diode of FIG. 1B with the source connected to the drain of a FET implementation of a gated diode.
Figure 1D:
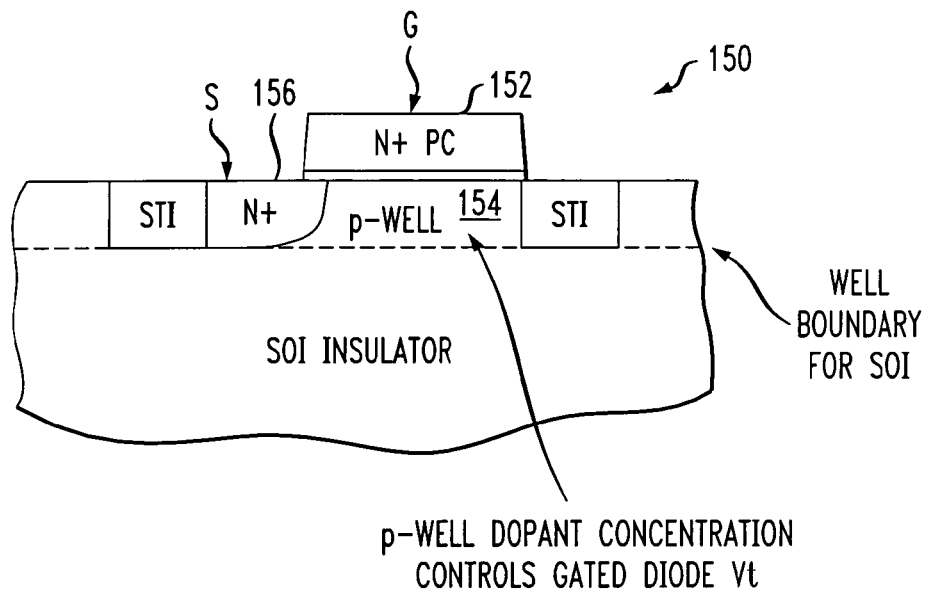
FIG. 1D shows a diagram of a gated diode for Silicon on Insulator (SOI) technology.
Figure 1E:
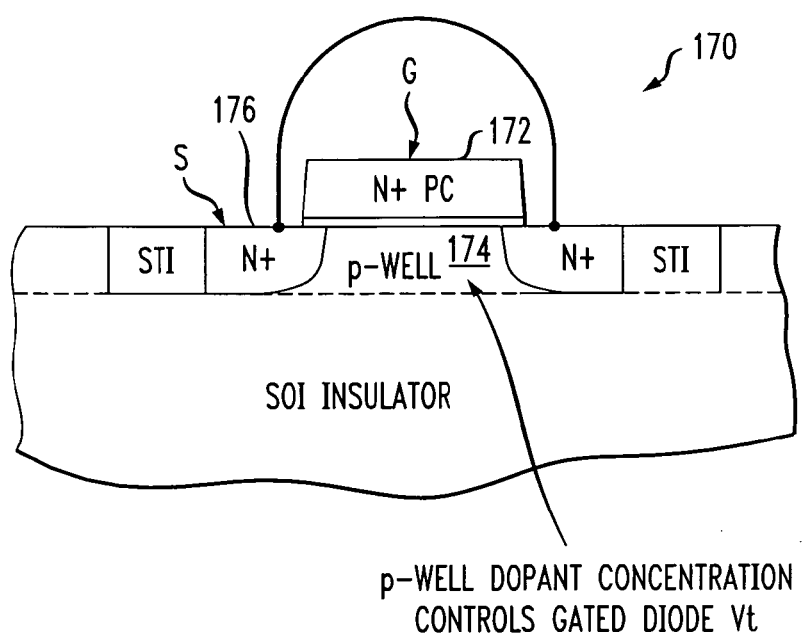
FIG. 1E shows an alternative embodiment of the gated diode of FIG. 1D with the source connected to the drain of a FET implementation of a gated diode in SOI.

FIG. 1A shows equivalent symbols 101 for a gated diode featuring a gate G and a source S. The gated diode can be implemented with a Field-Effect Transistor (FET), where the gate of the FET is the gate of the gated diode, the source of the FET is the source of the gated diode, and the drain of the FET is floating or connected to the source of the FET. FIGS. 1B–1E show various implementations of a gated diode implemented as a MOS device 110, 130, 150, 170. FIG. 1B shows a cross-section diagram of the structure of a gated diode 110 in bulk silicon. FIG. 1D shows a cross-section diagram of the structure a gated diode 150 for Silicon on Insulator (SOI) technology. FIGS. 1C and 1E show alternative embodiments of the gated diodes 110, 150 of FIGS. 1B and 1D, respectively, with the source connected to the drain of the FET implementing gated diode 130, 170. Charge is stored in the inversion layer 114, 134, 154, 174 under the gate 112, 132, 152, 172 when the gate to source voltage (Vgs) is above the threshold voltage ($V_t$) of the gated diode 110, 130, 150, 170, resulting in a large capacitance between the gate 112, 132, 152, 172 and source 116, 136, 156, 176. Likewise, when Vgs is below the threshold voltage, no charge is stored below the gate 112, 132, 152, 172 as the inversion layer 114, 134, 154, 174 disappears (except in the second order capacitances).

Figure 2:
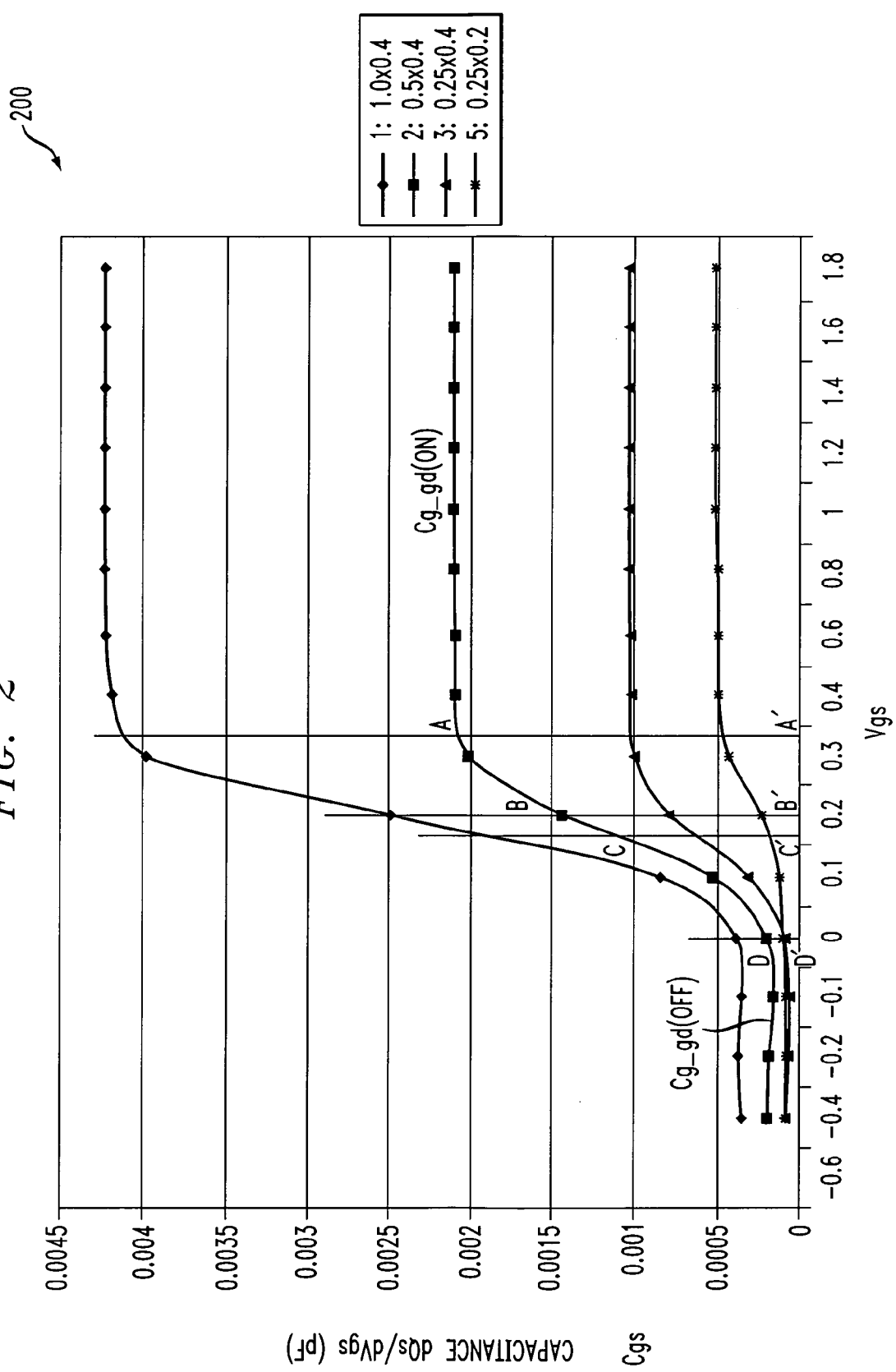
FIG. 2 shows a graph of the gate capacitance Cgs (obtained from dq/dv) versus Vgs for an n-type gated diode in bulk silicon.

FIG. 2 shows a graph of the gate to source capacitance Cgs (obtained from dq/dv) versus Vgs for an n-type gated diode in bulk silicon. The gate to source capacitance Cgs includes the gate MOS capacitance formed by the dielectric under the gate 112, 132, 152, 172 and the overlap capacitance between the gate 112, 132, 152, 172 and the source 116, 136, 156, 176 (excluding the gate to body and the source to body capacitance). Each curve in FIG. 2 corresponds to a gated diode 110, 130, 150, 170 of a certain gate area. For example, curve ABCD shows the gate capacitance Cgs versus Vgs curve of a gated diode 110, 130, 150, 170 with $V_t$ equal to 0.16V (point C). When $V_{gs}$ is above $V_t$, there is a substantial amount of charge stored in the inversion layer 114, 134, 154, 174 (point A); and when Vgs is below $V_t$, the amount of inversion charge is orders of magnitude smaller (point D). The gate to source ON capacitance reaches a maximum at point A (~150 mV above $V_t$ with Cgd(ON)~2.1 fF). When $V_{gs}$ is below $V_t$, the gate to source OFF capacitance reaches a minimum at Point D (~150 mV below $V_t$ with Cgd(OFF)~0.2 fF). In the latter case ($V_{gs}$ is below $V_t$), the inversion charge and capacitance are absent, and only the overlap capacitance between gate 112, 132, 152, 172 and source 116, 136, 156, 176 is present. As illustrated in FIG. 2, the capacitance changes drastically around $V_t$ (point C) and its value levels off quickly at voltages of approximately $V_t$–150 mV and $V_t$+150 mV. The gated diode threshold voltage (Vt_gd) can be controlled by the amount of implanted dopant (a key parameter in circuit design). This involves a trade off between margins of signal, noise, and $V_t$ variation. A low dopant level giving Vt_gd in the range of 50 to 100 mV is desirable to provide a good amount of charge and voltage for 1-data, and sufficient separation from ground noise.

Figure 3B:
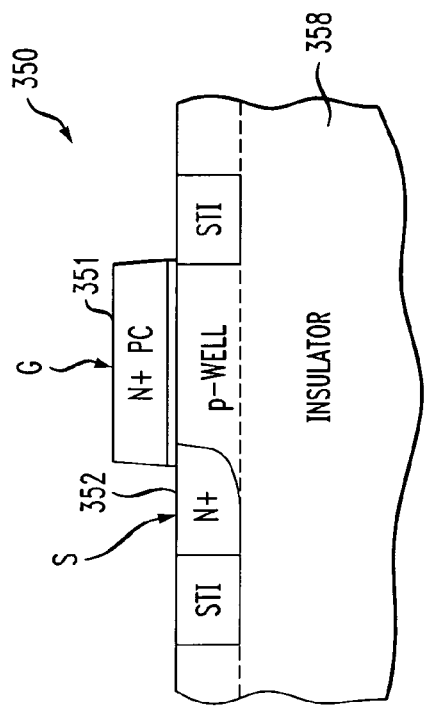
FIG. 3B shows the equivalent circuit of a gated diode for Silicon on Insulator, with capacitance components between gate, source, body and substrate.
Figure 3B:
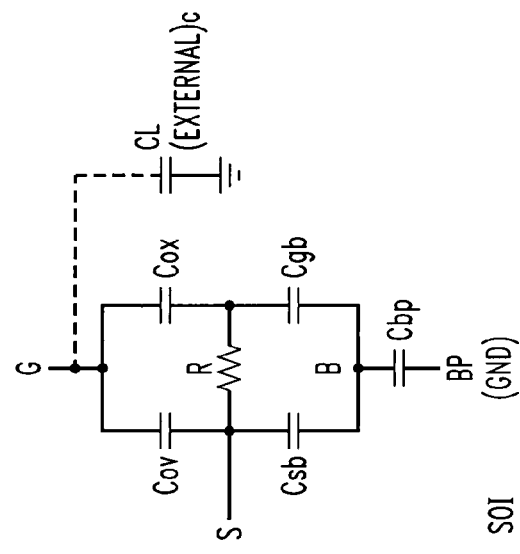
Figure 3A:
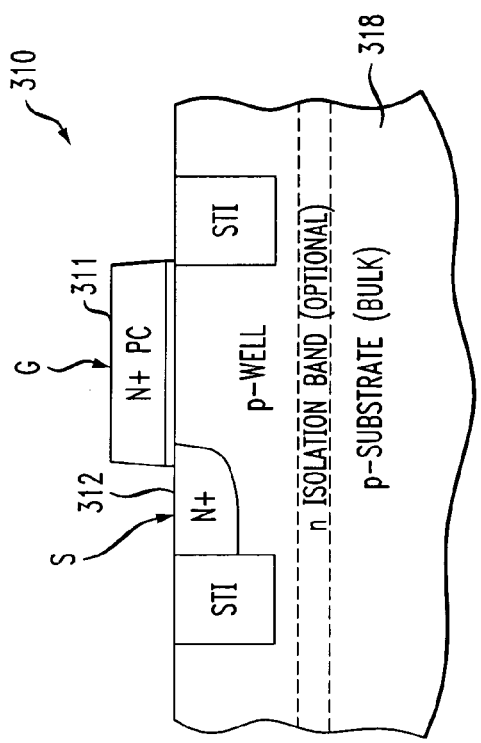
FIG. 3A shows the equivalent circuit of a gated diode for bulk silicon, with capacitance components between gate, source, body and substrate.
Figure 3A:
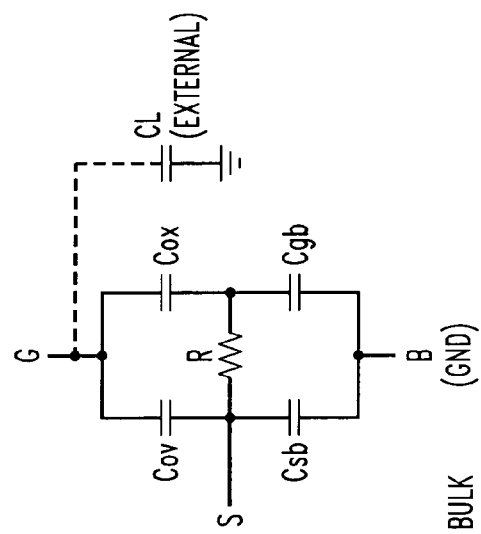

FIGS. 3A and 3B show equivalent circuits of a gated diode 310, 350 for bulk silicon and SOI, respectively, with the capacitance components between gate 311, 351, source 312, 352, body 314, 354 and substrate 318, 358. The second order capacitances, such as the gate to body capacitance Cgb, source to body capacitance Csb, and gate to source overlap capacitance 321, 361 are shown in FIGS. 3A and 3B. Four capacitances, in terms of the internal capacitances of the gated diode and the load capacitance, are derived, namely, the ON and OFF capacitances Cgd(ON), Cgd(OFF) for the gated diode, and the ON and OFF capacitances CL(ON), CL(OFF) for the load. The equivalent ON and OFF load capacitances to ground, CL(ON) and CL(OFF), include the external load CL and the internal gated diode capacitances. For bulk silicon, Cgd(ON) equals to Cov+Cox, CL(ON) equals to CL, Cgd(OFF) equals to Cov, and CL(OFF) equals to CL+CoxCgb/(Cox+Cgb) for the gated diode 310. For SOI, Cgd(ON) equals to Cov+Cox, CL(ON) equals to CL, Cgd(OFF) equals to Cov+CsbCgb/(Csb+Cgb), and CL(OFF) equals to CL for the gated diode 350. As an example, for bulk silicon, when the gated diode 310 is OFF, the gate to body capacitance is equal to Cox in series with Cgb, and the equivalent OFF load capacitance CL(OFF) is derived by adding the above gate to body capacitance to CL; for the SOI case, CL(OFF) is equal to CL. (Note that Cox is much greater than Cgb, Csb for the bulk silicon case; Cox is much greater than Cgb and Csb is much greater than Cbp for the SOI case.)

Figure 4A:
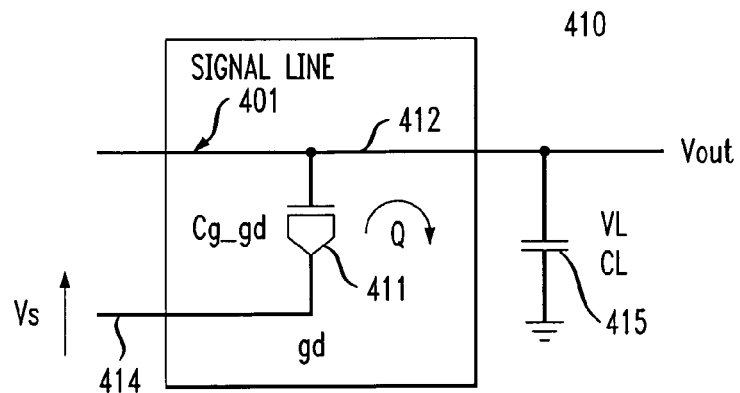
FIG. 4A shows a circuit of a gated diode amplifier for one-way, non-linear voltage boosting.

FIGS. 4A-4F show the principles of operation of gated diode signal amplification by one-way, non-linear voltage boosting, where a signal 401 is amplified only when the signal 401 is above $V_t$, resulting in a high gain. One-way voltage boosting means the high voltage is boosted significantly higher, whereas the low voltage is not boosted and remains low. As illustrated in FIG. 4A, the heart of the circuit 410 consists of a gated diode 411 with its gate 412 connected to a signal line 401 with load capacitance CL. A control voltage Vs is connected to the source 414 of the gated diode 411. The load capacitance CL(ON) and CL(OFF) represent the capacitance for on or off, respectively, and include the lumped total of external load capacitance CL and the internal equivalent capacitance from the gated diode 411, as summarized in FIGS. 4B and 4C. To operate the gated diode amplifier 410, the voltage at the source 414 of the gated diode 411 is raised at the time of signal evaluation.

Figure 4B:
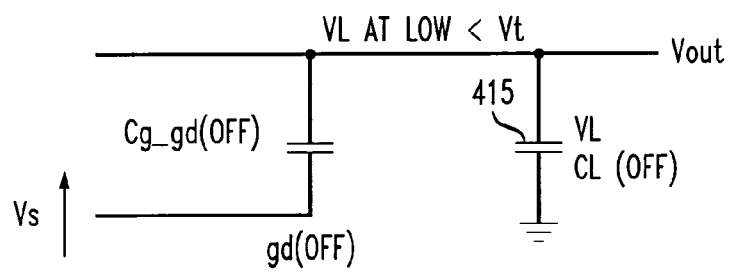
FIG. 4B shows the equivalent circuit for the gated diode amplifier of FIG. 4A for VL=LOW.
Figure 4C:
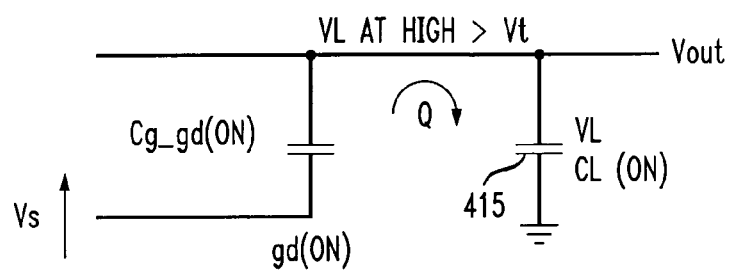
FIG. 4C shows the equivalent circuit for the gated diode amplifier of FIG. 4A for VL=HIGH.
Figure 4D:
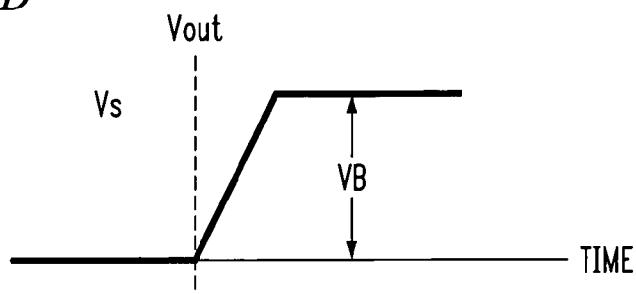
FIG. 4D shows a waveform of the source control signal (Vs) for voltage boosting.

For example, let the gate to source ON capacitance of the gated diode 411 be Cgd(ON), the OFF capacitance be Cgd(OFF), Rc equal Cgd(ON)/CL(ON), and rc equal Cgd (OFF)/CL(OFF). The total load CL(ON) and CL(OFF) are lumped capacitances at the signal line 401 to ground, and may include the gate to source capacitance Cgs of a next stage FET, any stray capacitance on the signal line 401 to ground, and device capacitance, e.g., the gate to body capacitance Cgb of the gated diode 411 when it is OFF. As shown in FIG. 4B, VL_LOW is the voltage level for a "0" (or 0-data), and VL_LOW is less than Vt_gd. When Vs is raised, the voltage at the gate 412 stays almost at zero since Cgd(OFF) (point D in FIG. 2) is much smaller than CL(OFF). The voltage is given by VL_LOW+VB rc/(1+rc), where VB is the voltage that Vs is raised by. As shown in FIG. 4C, VL_HIGH is the voltage level for a "1" (or 1-data), and VL_HIGH is greater than Vt_gd. There is a substantial amount of charge stored in the inversion layer of the gated diode 411, given by (VL_HIGH−Vt_gd) Cgd(ON) and represented by point A (or some point a, with higher $V_{gs}$, to the right of A on curve A-B-C-D) in FIG. 2. When Vs is raised by VB, there is a large voltage increase at the gate 412 of the gated diode 411. The maximum voltage is given by VL_HIGH+VB Rc/(1+Rc). The final voltage Vg_f depends on the amount of charge stored and transferred, and Rc.

By properly designing the gated diode ON capacitance and the load ON capacitance, Rc is much greater than 1 and there is enough charge in the gated diode 411 to transfer to the load CL(ON), without affecting the gated diode ON capacitance significantly (e.g., from point A or a to B in FIG. 2). The gated diode 411 is operating under the constrained charge transfer mode, e.g., VL_HIGH equals 0.6V (point a) and VB equals 1.2V; if the final gate voltage (Vg_f) equals 1.4V, then the final Vgs of the gated diode will be 0.2V (point B). The charge transferred out from the gated diode 411 to the load CL(ON) is the area under the curve a-A-B.

By properly designing the gated diode circuit, Cgd(ON) is much greater than CL(ON) and CL(OFF) is much greater than Cgd(OFF), and the output voltage at the gate 412 can be approximated by:

$$V\text{out}(1) = VL\_HIGH + VB\, Rc/(1+Rc)$$

$$V\text{out}(0) = VL\_LOW + VB\, rc/(1+rc)$$

Figure 4E:
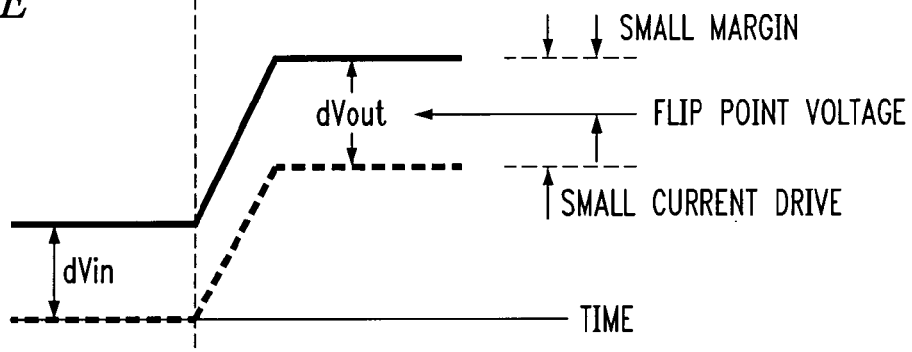
FIG. 4E shows an output waveform of voltage boosting with a linear capacitor.
Figure 4F:
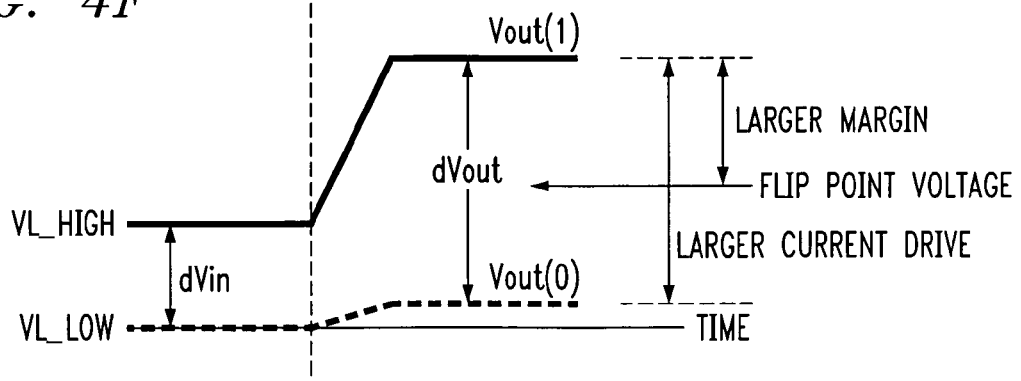
FIG. 4F shows an output waveform for the gated diode circuit of FIG. 4A.

FIG. 4E shows a waveform of the voltage boosting of the gated diode circuit of FIG. 4A where the gated diode is replaced with a linear capacitor. In this case, both the high and low input voltage are boosted equally. FIG. 4F shows a waveform of the voltage boosting of the gated diode circuit of FIG. 4A, where only the high input voltage (1-data) is boosted high significantly and the low input voltage (0-data) remains low. As shown in FIGS. 4E and 4F, let dVin be the difference of the gate voltage between 0- and 1-data before Vs is raised, and dVout be such difference after Vs is raised. Typically, VL_LOW equals 0. In the case of a linear capacitor (FIG. 4E), the capacitance is constant throughout for 0- and 1-data. Thus, dVin equals dVout, and the gain equals 1. In the gated-diode 410 case (FIG. 4F):

$$dVout = VL\_HIGH + VB\,Rc/(1+Rc) - (VB\,rc/(1+rc) + VL\_LOW)$$

$$dVin = VL\_HIGH - VL\_LOW$$

$$\text{gain} = dVout/dVin$$
$$= 1 + (VB/VL\_HIGH)[Rc/(1+Rc) - rc/(1+rc)] > 1$$

In the example shown, VB equals 1.2V, VL_HIGH equals 0.6V, VL_LOW equals 0, rc equals 0.1, and Rc equals 9, resulting in dVout equal to 1.57V, dVin equal to 0.6V, and a gain of 2.62. In addition to the gain advantage, the gated diode circuit 410 provides more signal margin and signal-to-noise ratio for voltage distinction at the output stage.

Inverter Output Circuit

Without loss of generality, assume an inverter 410, with its input connected to the signal line 401, is used to detect and invert the 0- and 1-data. As noted above, FIG. 4E and FIG. 4F show the 0- and 1-voltage levels of the linear capacitor case and the gated diode case, respectively. FIG. 4E shows a characteristic waveform of using a linear capacitor, where both 0- and 1-signals are amplified, resulting in no gain. FIG. 4F shows a characteristic waveform of the voltage boosting by gated diode circuit 410. The 0-1 flip point would be selected mid-way between the 0- and 1-data output, the mid-point of dVout is shown in FIGS. 4E and 4F. The gated diode circuit 410 shows high signal margin for separating a 0- and a 1-signal (dVout), and high current drive for the output stage, achieving high speed compared to the linear capacitor case (FIG. 4E). The detection margin can be defined as dVout/2. Since the gated diode 411 has a much larger dVout, it has a much higher margin of error to separate 0 and 1 compared to the linear capacitor case. Furthermore, the output current and speed of the inverter 410 are determined by the input overdrive voltage which is |Vout−Vt| for both PFET and NFET. Such overdrive equates to dVout for both 0- and 1-data. Since dVout is much larger for the gated diode case 410, its output current is higher and its speed is faster compared to the linear capacitor version.

For example, let Vg_f be the final gate voltage. The final voltage across the gated diode 411 is (Vg_f−VB) and is less than the initial voltage VL_HIGH. Let Vxfer be the voltage drop across the gated diode 411, where Vxfer equals VL_HIGH+VB−Vg_f. As the load voltage increases, part or all of the charge in the gated diode 411 is transferred to the load 415. The charge transfer Qxfer is given by:

$$Qxfer=(Vg\_f-VL\_HIGH)\ CL(ON)=(VB-Vxfer)\ CL(ON).$$

Qxfer is given by the area under the capacitance Cgs–Vgs curve between VL_HIGH and (Vg_f–VB) (points a-A-B in FIG. 2). Vg_f can be determined graphically or numerically from Qxfer. For example, if, initially, Vgs(at point a) equals VL_HIGH, the charge transfer is represented by moving from point a to A to B, and the final voltage is given by point B: Vg_f=VB+Vgs(at point B). The gain can then be calculated by $$gain=dVout/dVin=(Vg\_f-VB\ rc/(1+rc))/VL\_HIGH$$

For small Rc, all the charge stored in the gated diode 411 is transferred to the load 415. This is the complete charge transfer mode, represented by curves B-D or A-D or a-D in FIG. 2. The gated diode 411 is turned off. The final voltage at the gate Vg_f is given by:

$$Qxfer = (VL\_HIGH - Vt\_gd)Cgd(ON) = (Vg\_f - VL\_HIGH)CL(ON)$$

$$Vg\_f = (VL\_HIGH - Vt\_gd)Cgd(ON)/CL(ON) + VL\_HIGH$$

$$Vg\_f = (VL\_HIGH - Vt\_gd)Rc + VL\_HIGH$$

$$\begin{aligned} gain &= dVout/dVin \\ &= (Vg\_f - VB\,rc/(1+rc))/VL\_HIGH \\ &= 1 + Rc(1 - Vt\_gd/VL\_HIGH) - (VB/VL\_HIGH)rc/(1+rc) \sim 1 \end{aligned}$$

For example, if Rc=1, rc=0.1, Vt_gd/VL_HIGH=0.33, VB/VL_HIGH=5, and the gain=1+1(1−0.33)−5(0.1/1.1)=1.22.

When the source voltage returns to ground, the charge that transferred out of the gated diode 411 to CL(ON) during a read operation will return back to the gated diode 411, the gate voltage will return to the pre-boosted value, and the total charge stored in the gated diode 411 and its load 415 will be conserved before and after the read.

The precision of the threshold voltage ($V_t$) of the gated diode 411 is crucial to detect the small signal 401 accurately. It is desirable to have the $V_t$ midway between the low and high of the small signal voltage to distinguish between the 0- and 1-data. More importantly, the $V_t$ variation of the gated diode 411 has to be small over various manufacturing processes and wafer variations, in order to avoid giving a false-0 when the $V_t$ shifts up, and a false-1 when the $V_t$ shifts down. The allowable percentage variation in $V_t$ of the gated diode 411 has to be even smaller than that allowed for convential logic gates due to the small magnitude of the signal 401. The gated diode 411 can be designed with low $V_t$ and low dopant concentration, which would provide minimal $V_t$ variation and maximal signal detection separation. The short channel or roll-off effect for short channel logic devices is not an issue because the gated diode 411 has no drain voltage to induce DIBL (drain-induced barrier lowering) effect.

Figure 5:
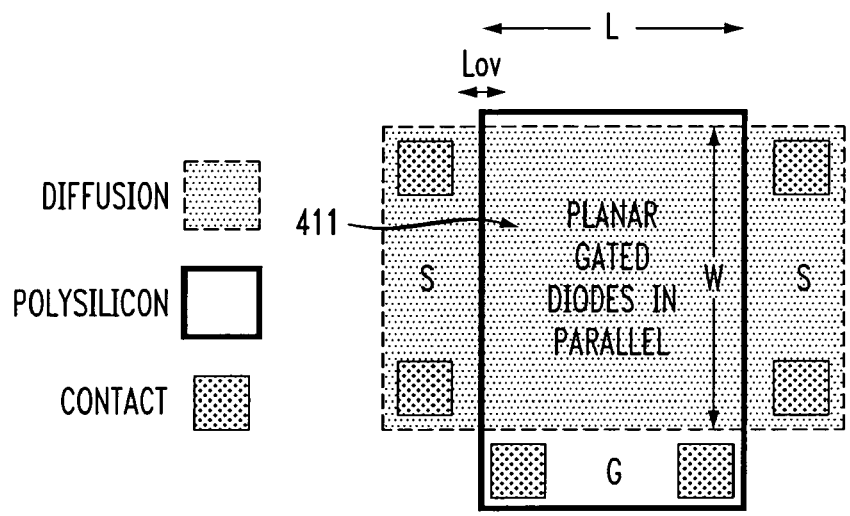
FIG. 5 illustrates the design parameters of a gated diode layout structure.

FIG. 5 illustrates the design parameters of a gated diode 411. As shown in FIG. 5, since the gated diode 411 needs to be a certain size to achieve the required gated diode capacitance to load capacitance ratio (Rc and rc) to achieve the required gain as described earlier, the channel length of the gated diode 411 is not necessarily of a minimal channel length like the rest of the FET devices used for logic. In order to maximize the gain, the ratio of the gated diode ON and OFF capacitance should be the highest possible. Consequently, the ratio of the gate capacitance Cox to the gate to source overlap parasitic capacitance Cov should be as large as possible for a given gate capacitance Cox. Since Cox/Cov equals L/Lov, where L is the gate length and Lov is the overlap length between the gate and the source, L should be made as large as possible provided that the threshold profile variation and the RC delay for carrier transport is within certain requirements.

Other Logic Circuits

By applying the gated diode high gain signal amplification for small signals 401, and the precision control of gated diode threshold voltage ($V_t$), a number of gated diode logic circuits 600, 700, 800, 900 for small signals 601, 701, 801, 901 are disclosed, as well as logic circuits 1000, 1100, 1200 implementing arbitrary logic functions and with an arbitrary number of small input signals 1001, 1101, 1201 and output signals 611, 711, 811, 911, 1011, 1111, 1211.

Gated Diode Inverter Circuit

Figure 6:
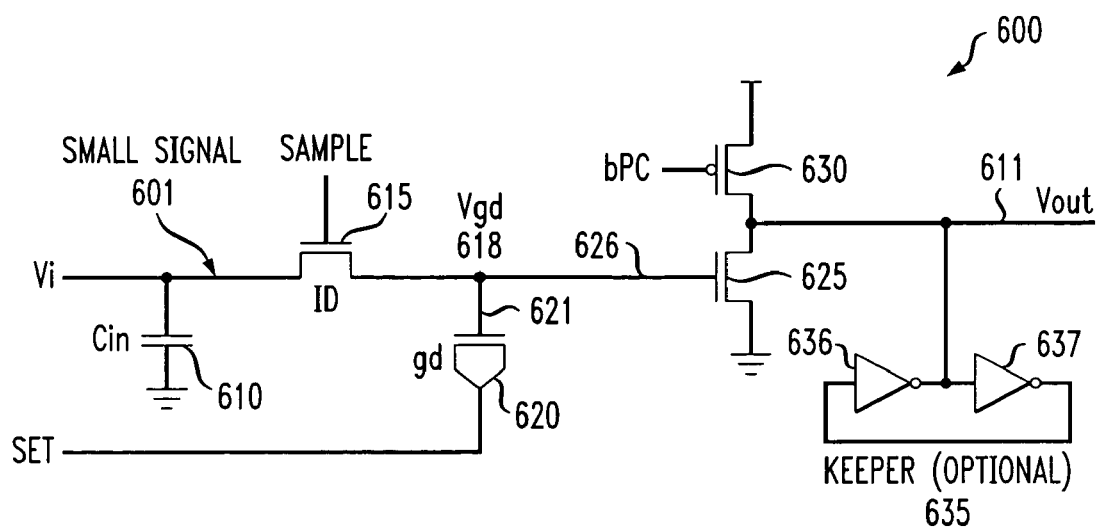
FIG. 6 shows a circuit diagram of a gated diode small signal inverter.

FIG. 6 shows a gated diode inverter 600 with two control signals SET and SAMPLE, as well as the precharge control signal bPC for precharging the dynamic output Vout via PFET 630. SET and bPC can be the same control signal; the control signal SAMPLE can be the complement of SET logically, such that SET is a delayed complement of SAMPLE. During a SAMPLE phase (SAMPLE=1, SET=0, and bPC=0), the small signal 601 is sampled and passes through the isolation device (ID) 615 and is held (temporarily) at gated diode node 618 (Vgd) by the capacitance of the gate 621 of the gated diode 620 and the gate 626 of the output stage NFET 625. Here, as with all logic circuits 700, 800, 900, 1000, 1100, 1200 described below, a logic 1 and high voltage are used interchangeably, unless specified otherwise; similarly, a logic 0 and low voltage are used interchangeably.

During operation of the inverter 600, the output Vout (611) is initially precharged to high via PFET 630 during the SAMPLE phase where bPC=0. At the end of the SAMPLE phase, SAMPLE switches to a low and the sampled small signal voltage is held by the capacitance at the gated diode node 618 as Vgd. During the EVALUATION phase, the bPC control signal switches to 1 so that Vout is free to change, the SET control signal switches to 1 (SAMPLE switches to 0), and ID 615 has been turned OFF. In the case of 1-data, the gated diode 620 then boosts the corresponding temporarily held small signal Vgd to a full or almost full logic high voltage and, in the case of 0-data, Vgd remains low. The full logic voltage of the gated diode boosted Vgd corresponding to 0- and 1-data would then determine the output node (Vout) voltage: high and low, respectively, as the precharged output node remains high for 0-data and switches to low for 1-data, hence performing an inverter function on a small signal 601. The output can then be stored or passed to a subsequent logic stage. As in the case of the logic circuits 700, 800, 900, 1000, 1100, 1200 described below, a keeper circuit 635, made up of two small inverters 636, 637 that form a latch, is optional, and is used for holding Vout, if needed, for an indefinite period of time. After the evaluation phase, the SET and bPC control signals return to low, and the SAMPLE control signal returns to high to complete a SAMPLE and SET cycle.

Even operating under heavy input line loading and small signal conditions, this gated diode inverter 600 can achieve very fast switching time, since the gated diode capacitive loading can be limited to a very small amount, equivalent to the loading of minimum feature size. For use in a bank or a large number of parallel circuits, the two SAMPLE and SET control signals, as well as the bPC control signal, can be shared among many circuits. The $V_t$ and $V_t$ fluctuation of the gated diode 620 can be controlled precisely using known techniques. The disclosed circuit is robust and tolerant to $V_t$, voltage and process variation.

Gated Diode N to 1 Multiplexer Circuit

Figure 7:
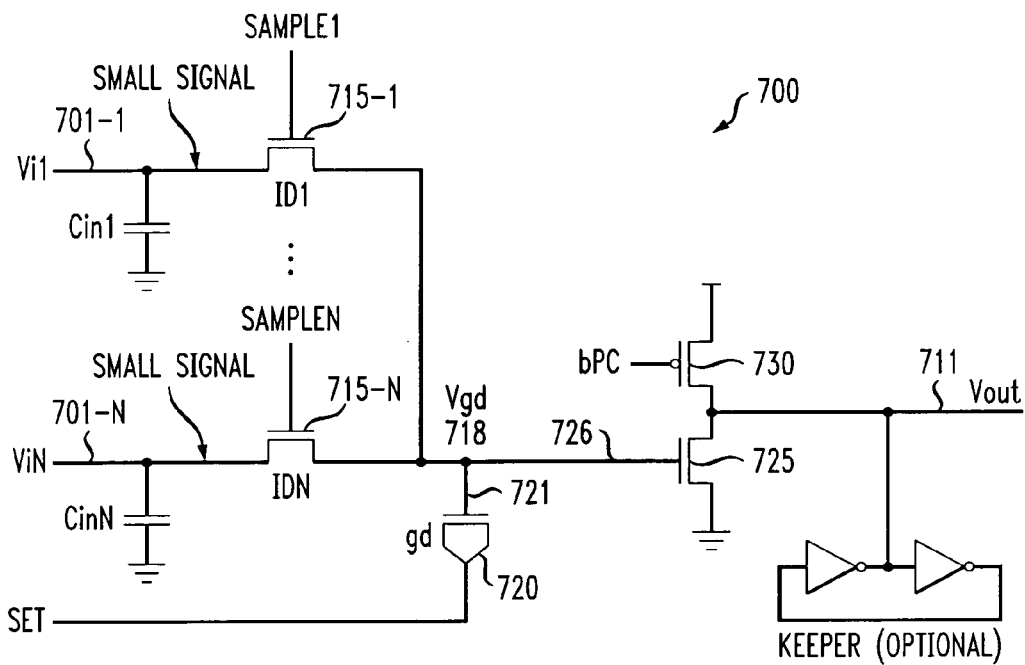
FIG. 7 shows a circuit diagram for an N-input gated diode N to 1 multiplexer for small signals.

FIG. 7 shows a N-input gated diode N to 1 multiplexer 700 with a control signal SET and N control signals SAMPLE1, . . . , SAMPLEN (hereinafter, collectively known as SAMPLE), as well as a precharge control signal bPC, for precharging the dynamic output Vout (711) to high via PFET 730 during the SAMPLE phase where bPC=0. SET and bPC can be the same control signal; SET can a delayed complement of the logical OR of the SAMPLE signals. During the SAMPLE phase, only one of the N SAMPLE signals (SAMPLE1 . . . SAMPLEN) is 1, SET=0, and bPC=0; the corresponding small signal 701 is sampled and passes through one of the corresponding isolation devices (ID1, . . . , IDN) 715 and is held (temporarily) at the Vgd node 718 by the capacitance of the gate 721 of the gated diode 720 and the gate 726 of the output stage NFET 725. The output Vout is precharged to 1. At the end of the SAMPLE phase, SAMPLE switches to 0 and the sampled small signal voltage is held by the capacitance at the gated diode node 718 as Vgd. During the EVALUATION phase, the bPC control signal switches to 1, the SET control signal switches to 1 (SAMPLE switches to 0), and ID1, . . . , IDN have been turned OFF. One of the N signals is sampled and stored at the Vgd node 718, and will determine the multiplexer output Vout as follows. In the case of 1-data, the gated diode 720 then boosts the corresponding temporarily held small signal Vgd to a full or almost full logic high voltage and, in the case of 0-data, Vgd remains low. The full logic voltage of the gated diode boosted Vgd corresponding to 0- and 1-data would then determine the output node (Vout) voltage: high and low, respectively, as the precharged output node remains high for 0-data and switches to low for 1-data, hence performing an N to 1 multiplexing on N small signals 701-1 to 701-N. As described above, the output can then be stored or passed to a subsequent logic stage. After the evaluation phase, the SET and bPC control signals return to low and the SAMPLE control returns to high to complete a SAMPLE and SET cycle.

Gated Diode NAND Circuit

Figure 8:
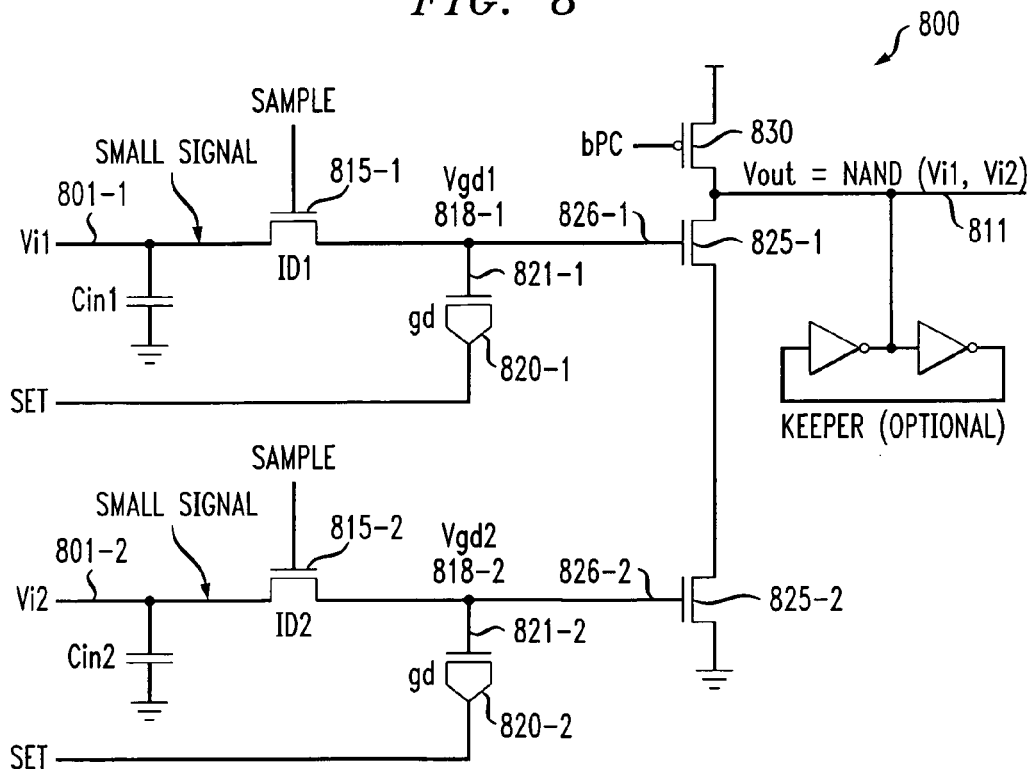
FIG. 8 shows a circuit diagram for a 2-input small signal gated diode NAND gate.

FIG. 8 shows a 2-input gated diode NAND gate 800 with two control signals SET and SAMPLE, as well as a precharge control signal bPC, for precharging the dynamic output Vout (811) to high via PFET 830 during the SAMPLE phase where bPC=0. SET and bPC can be the same control signal; the control signal SAMPLE can be the complement of SET logically, such that SET is a delayed complement of SAMPLE. During the SAMPLE phase (SAMPLE=1, SET=0, and bPC=0), the two small signals 801-1, 801-2 are sampled and pass through the corresponding isolation devices (ID1, ID2) 815-1, 815-2 and are held (temporarily) at Vgd1, Vgd2, by the capacitance of the gates 821-1, 821-2 of the gated diodes 820-1, 820-2 and the gates 826-1, 826-2 of the output stage NFET's 825-1, 825-2. The output Vout is precharged to 1. At the end of the SAMPLE phase, SAMPLE switches to 0 and the two sampled small signal voltages are held respectively by the capacitance at the gated diode nodes 818-1, 818-2 as Vgd1, Vgd2. During the EVALUATION phase, the bPC control signal switches to 1, the SET control signal switches to 1 (SAMPLE switches to 0), and ID1 and ID2 have been turned OFF. In the case of 1-data at the gated diode node, the gated diodes 820-1, 820-2 then boost the corresponding temporarily held small signal Vgd's to a full or almost full logic high voltage and, in the case of 0-data, Vgd's remain low. The full logic voltage of the gated diode boosted Vgd's corresponding to 0- and 1-data would then determine the output node (Vout) voltage: high or low, as the precharged output node remains high if at least one of the inputs are 0-data, and switches to low if both of the inputs are 1-data, hence performing a NAND operation on the two small input signals 801-1, 801-2. The output can then be stored or passed to a subsequent logic stage. After the evaluation phase, the SET and bPC control signals return to low and the SAMPLE control returns to high to complete a SAMPLE and SET cycle.

The described gated diode NAND circuit 800 for two small input signals 801-1, 801-2 can be readily extended to a NAND logic circuit with N small input signals 801, by using N gated diodes 820, N isolation devices 815 and N NFET's 825 and connecting the NFET's 825 in series from the output node to ground, as would be apparent to a person of ordinary skill in the art. In general, arbitrary logic circuits with N inputs can be constructed in this fashion by those of ordinary skill in the art.

Gated Diode NOR Circuit

Figure 9:
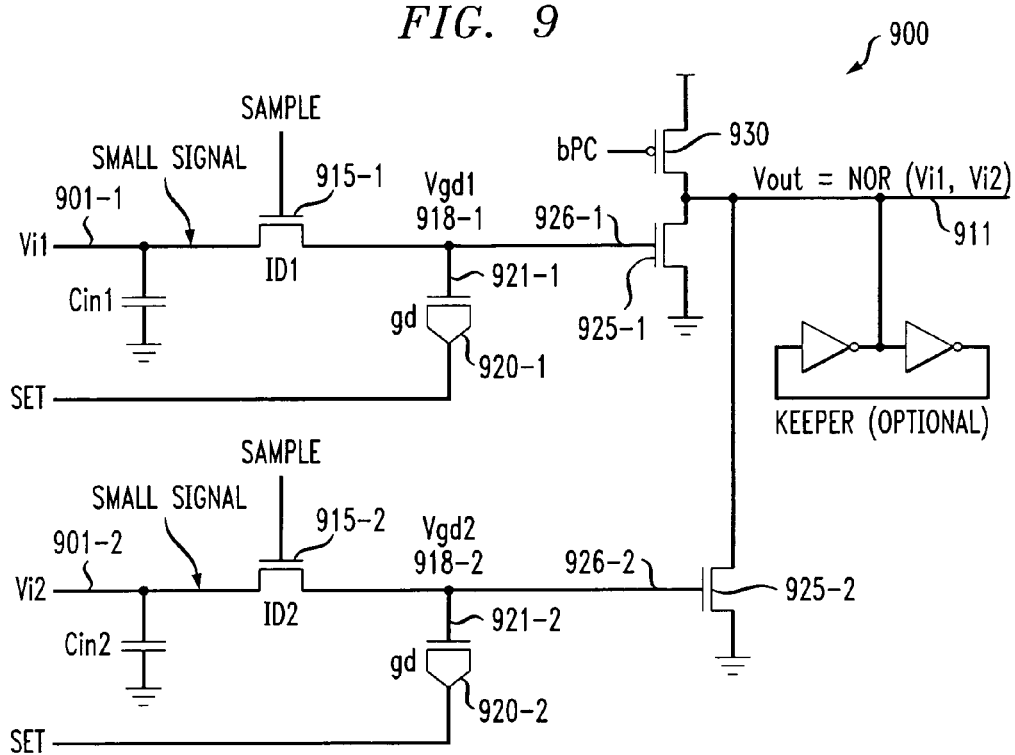
FIG. 9 shows a circuit diagram for a 2-input small signal gated diode NOR gate.

FIG. 9 shows a 2-input gated diode NOR gate 900 with two control signals SET and SAMPLE, as well as a precharge control signal bPC, for precharging the dynamic output Vout (911) to high via a PFET 930 during the SAMPLE phase where bPC=0. SET and bPC can be the same control signal; the control signal SAMPLE can be the complement of SET logically, such that SET is a delayed complement of SAMPLE. During the SAMPLE phase (SAMPLE=1, SET=0, and bPC=0), the two small signals 901-1, 901-2 are sampled and pass through the corresponding isolation devices (ID1, ID2) 915-1, 915-2 and are held (temporarily) at Vgd1, Vgd2 by the capacitance of the gate 915-1, 915-2 of the gated diodes 920-1, 920-2 and the gates 926-1, 926-2 of the output stage NFET's 925-1, 925-2. The output Vout is precharged to 1. At the end of the SAMPLE phase, SAMPLE switches to 0 and the two sampled small signal voltages are held respectively by the capacitance at the gated diode nodes 918-1, 918-2 as Vgd1, Vgd2. During the EVALUATION phase, the bPC control signal switches to 1, the SET control signal switches to 1 (SAMPLE switches to 0), and ID1 and ID2 have been turned OFF. In the case of 1-data at the gated diode node, the gated diodes 920-1, 920-2 then boosts the corresponding temporarily held small signal Vgd's to a full or almost full logic high voltage and, in the case of 0-data, Vgd's remains low. The full logic voltage of the gated diode boosted Vgd's corresponding to 0- and 1-data would then determine the output node (Vout) voltage: high or low, as the precharged output node remains high if both of the inputs are 0-data, and switches to low if at least one of the inputs are 1-data, hence performing a NOR operation on the two small inputs signals 901-1, 901-2. The output can then be stored or passed to a subsequent logic stage. After the evaluation phase, the SET and bPC control signals return to low and the SAMPLE control returns to high to complete a SAMPLE and SET cycle.

The described gated diode NOR circuit for two small input signals 901 can be readily extended to NOR logic circuit with N small input signals 901, by using N gated diodes 920, N isolation devices 915 and N NFET's 925 and connecting the NFET's 925 in parallel from the output node to ground, as would be apparent to a person of ordinary skill in the art. Arbitrary logic circuits with N inputs 901 can be constructed in this fashion by those of ordinary skill in the art.

Description for Gated Diode Logic Circuit with N Inputs

Figure 10:
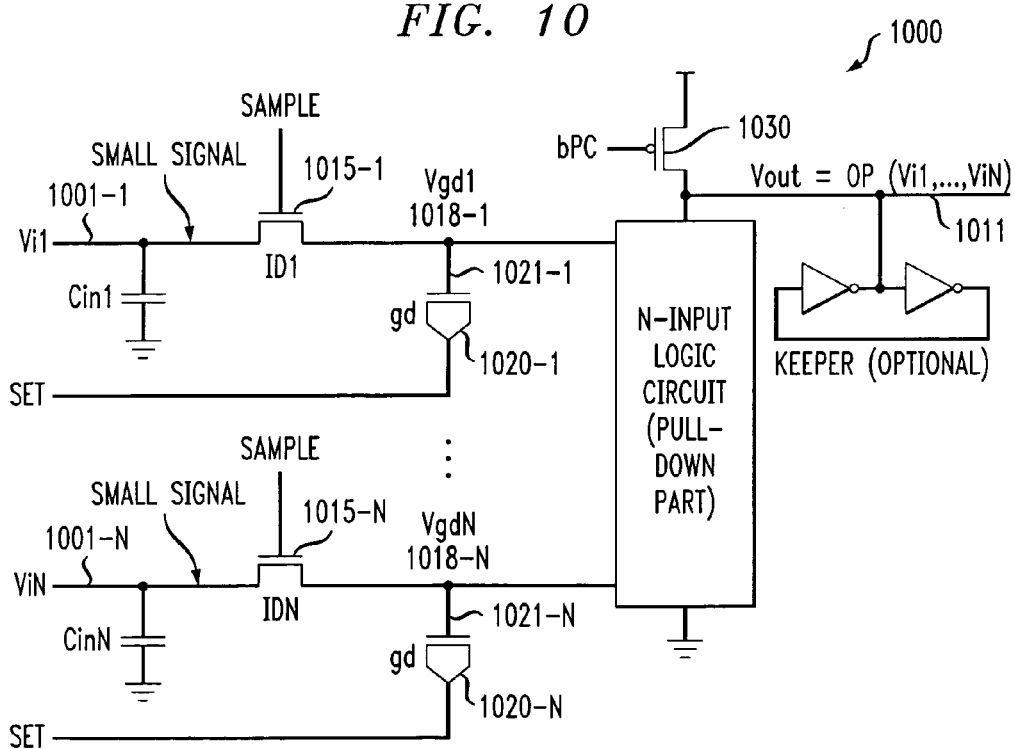
FIG. 10 shows a circuit diagram for an N-input gated diode logic circuit for small signals.

FIG. 10 shows an N-input gated diode logic circuit 1000 with N control signals SET and N control signals SAMPLE1 . . . SAMPLEN (hereinafter, collectively known as SAMPLE), as well as a precharge control signal bPC, for precharging the dynamic output Vout (1011) to high via a PFET 1030 during the SAMPLE phase where bPC=0. SET and bPC can be the same control signal. During the SAMPLE phase, one or more of the SAMPLE signals equals 1, SET equals 0, and bPC equals 0; one or more of the N small signals 1001 are sampled and pass through the corresponding N isolation devices (ID1, . . . , IDN) 1015-1, . . . N and are held (temporarily) at Vgd1, . . . , VgdN by the capacitance of the gates 1021-1, . . . N of the N gated diodes 1020-1, . . . N and the gates of the N output stage NFET's (not shown explicitly in FIG. 10, but can be located inside the N-input logic circuit). The output Vout is precharged to 1. At the end of the SAMPLE phase, SAMPLE switches to 0 and the N sampled small signal voltages are held respectively by the capacitance at the N gated diode nodes 1018-1, . . . N as Vgd1, . . . , VgdN. During the EVALUATION phase, the bPC control signal switches to 1, the SET control signal switches to 1 (SAMPLE switches to 0), and ID1, . . . , IDN have been turned OFF. In the case of any of the 1-data at the gated diode node, the gated diode(s) 1020-1, . . . N then boosts the corresponding temporarily held small signal Vgd's to a full or almost full logic high voltage and, in the case of any of the 0-data, the Vgd's remain low. The full logic voltage of the gated diode boosted Vgd's corresponding to 0- and 1-data would then determine the output node (Vout) voltage: high or low, as the precharged output node remains high if there is no ON path among all the NFET's to ground, and the precharged output node switches to low if there is an ON path of NFET's to ground, hence performing a given logic operation on the N small inputs signals 1001 by given pulldown logic circuits. The output can then be stored or passed to a subsequent logic stage. After the evaluation phase, the SET and bPC control signals return to low and the SAMPLE control returns to high to complete a SAMPLE and SET cycle.

Figure 11:
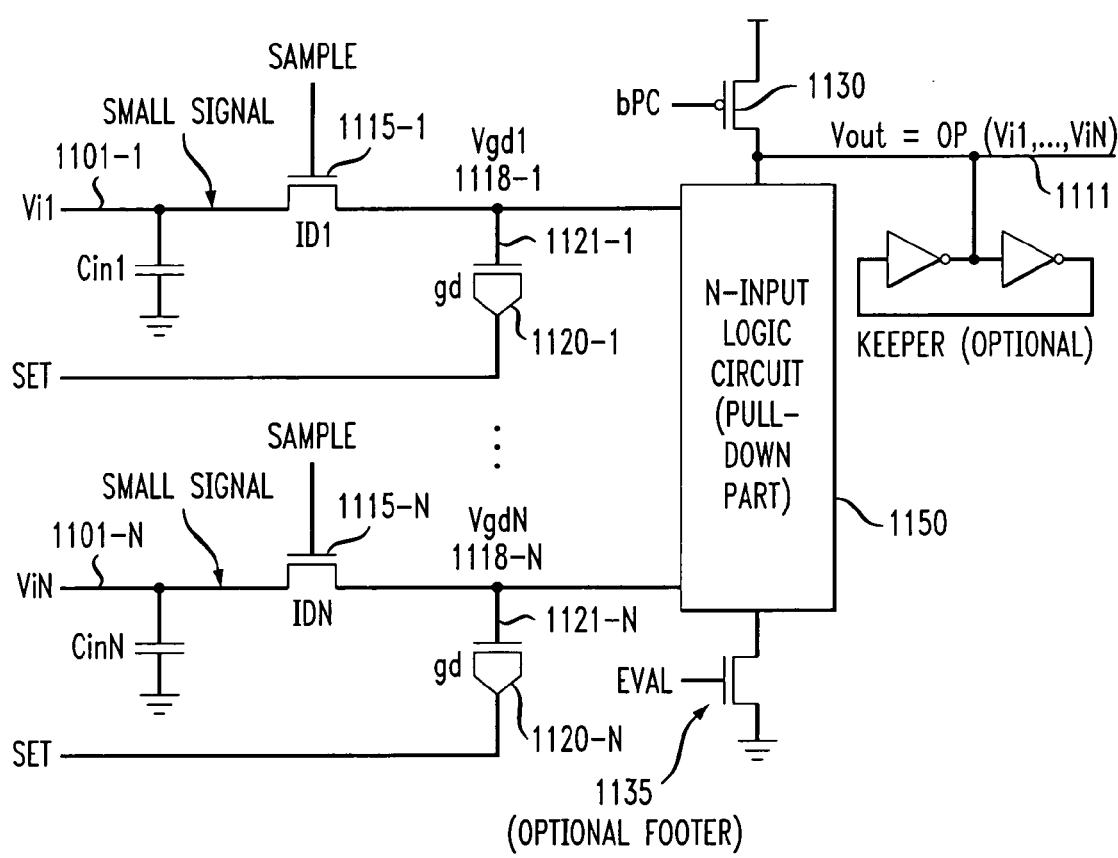
FIG. 11 shows a circuit diagram for an N-input gated diode logic circuit for small signals with an optional footer device.

The gated diode N-input logic circuit shown in FIG. 11 extends the gated diode N-input logic circuit of FIG. 10 by adding a "footer" device 1135 between the actual GROUND and all the original GROUND nodes of the pull-down part of the entire N-input logic circuit 1150. The original GROUND nodes become a common virtual GROUND connecting to the source/drain terminal of the footer device 1135. The virtual GROUND is at about 0 V when the footer device 1135 is ON. The footer device 1135 forms the series current path of the entire pull-down circuit to GROUND, and it can be used to limit leakage current flow from the supply voltage (VDD) to GROUND during the precharge or standby phase during which the logic state of the previous evaluation phase has been stored. The control signal EVAL is used to turn the footer device 1135 ON or OFF. During the evaluation phase, EVAL is high, so the NFET footer device 1135 is ON and the virtual GROUND of the pull-down circuit is at GROUND. The N-input logic circuit 1150 can then perform the desired logic function as described for FIG. 10. The footer device 1135 can also be implemented by using a PFET with its gate control signal EVAL set to low (0 V) during the evaluation phase.

Figure 12:
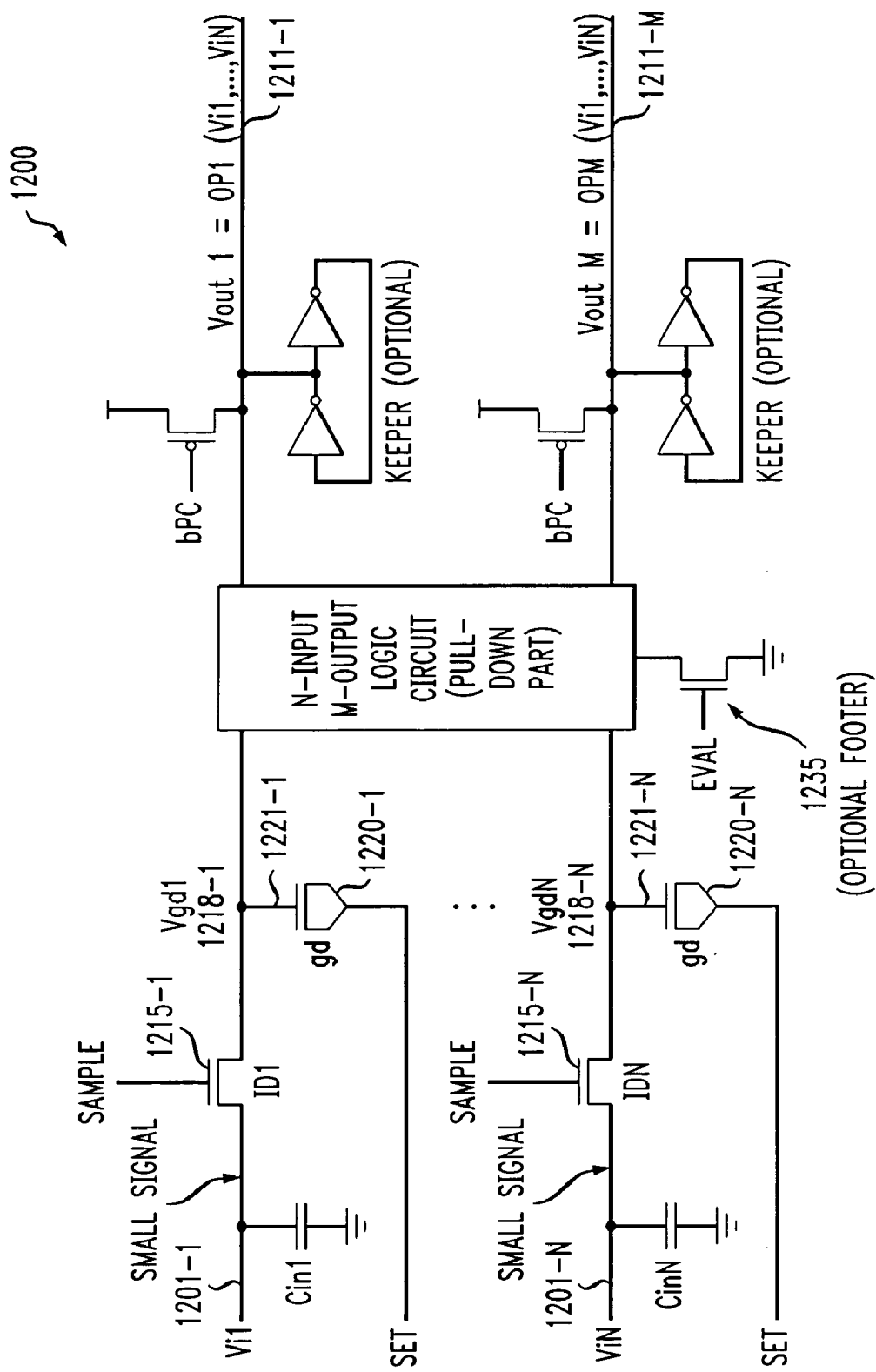
FIG. 12 shows a circuit diagram for an N-input, M-output gated diode logic circuit for small signals, with an optional footer device.

The gated diode N-input logic circuit shown in FIG. 12 extends the gated diode N-input logic circuit 1000, 1100 of FIG. 10 and FIG. 11 to handle multiple outputs, e.g., M-outputs (1211-1 to 1211-M), forming a gated diode N-input M-output logic circuit 1200. The EVAL control with footer device 1235 of FIG. 12 is optional. If the footer 1235 is not used, N-input M-output logic circuit 1200 forms an M-output version of the N-input logic circuit of FIG. 10; with the footer, it forms an M-output version of the N-input logic circuit of FIG. 11. N-input M-output logic circuit 1300 combines M of the gated diode logic circuits; each performs a specific N-input logic function to form an N-input M-output logic circuit. When forming an M-output logic circuit, logic optimization can be carried out to reduce the number of internal logic gates and transistors, such as by sharing and combining logic sub-circuits. It should be noted that each of the ports of the logic circuits described above may be for input only, output only, or a combination of input and output (I/O).

Exemplary Gated Diode Inverter Circuit Waveforms

Figure 13A:
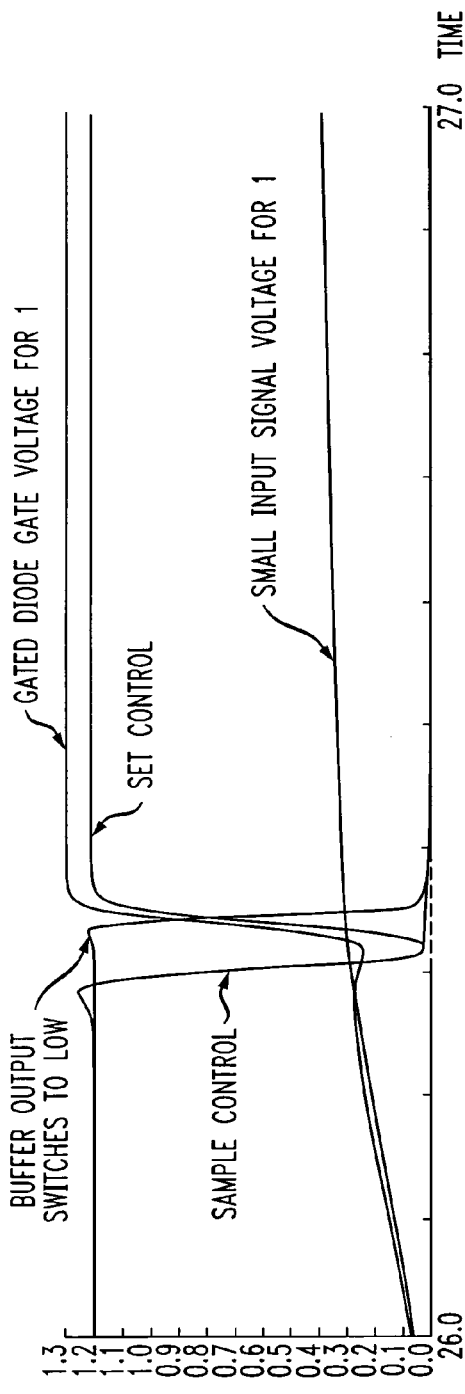
FIG. 13A shows a waveform that illustrates the operation of a gated diode inverter circuit for 1-data.
Figure 13B:
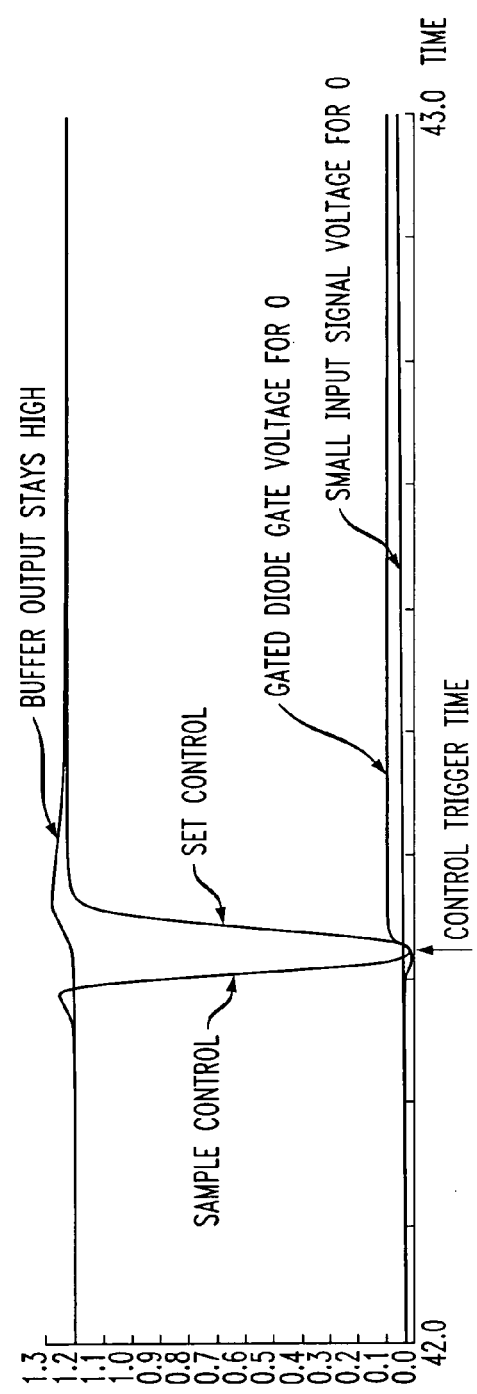
FIG. 13B shows a waveform that illustrates the operation of a gated diode inverter circuit for 0-data.

FIGS. 13A and 13B show two waveforms 1300, 1350 that illustrate inverting logic using a gated diode inverter circuit 600. The graph 1300 shows inverting a small signal voltage for logic 1, and the graph 1350 shows inverting a small signal voltage for logic 0. The voltage waveforms of the SAMPLE control, SET control, small input signal 601, gated diode gate 621 and output 611 versus time are shown. First, during the SAMPLE phase, the SAMPLE control is high to turn on the isolation device 615, so that the small signal 601 is applied via the isolation device 615 to the gate 621 of the gated diode 620 (Vgd). At a certain determined time, the SAMPLE control goes low and the isolation device 615 is turned off. The sampled voltage is stored in the gated diode 620 as Vgd. As soon as the SAMPLE control goes low and the isolation device 615 is turned OFF, the SET control is triggered to boost the gated diode voltage Vgd. In the case of logic 1 (the upper graph), the gated diode voltage sampled at Vgd is around 240 mV (20% of $V_{DD}$), and it is boosted to a high voltage of 1.29V with a supply voltage ($V_{DD}$) of 1.2V, with a fast rise time of 20 ps. The boosted high voltage at the gate 626 of the output buffer turns the output voltage to low with a fast fall time. In the case of logic 0 (the lower graph), the gated diode voltage (Vgd) stays low (around 90 mV) when the SET signal is triggered. The output of the output buffer stays high. The voltage gain achieved is (1.29−0.09)/(0.24−0)=5. The 0 or 1 output can then be stored or passed to a subsequent logic stage. After the SET phase (not shown in the figure), the SET and bPC control signals return to low and the SAMPLE control returns to high to complete a SAMPLE and SET cycle. Even under heavy input line loading, the circuit and its output node achieve very fast switching time, down to 20 ps as shown, since the gated diode loading can be limited to a very small amount equivalent to the loading of minimum feature size.

It should be pointed out that in the gated diode logic circuits of FIGS. 6-12, the logic circuit portions can be implemented in other different forms, such as the static CMOS logic circuit designs of FIGS. 14-19.

Figure 14:
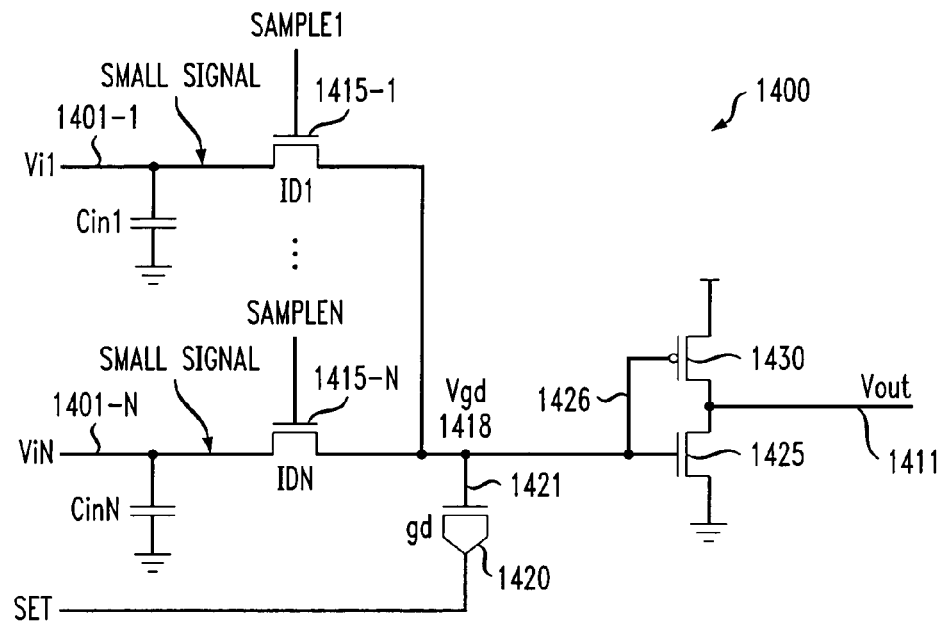
FIG. 14 shows a circuit diagram for a CMOS static version of the N-input gated diode N to 1 multiplexer for small signals of FIG. 7.

FIG. 14 shows a CMOS static version of the N-input gated diode N to 1 multiplexer for small signals of FIG. 7. The precharge PFET 730 is replaced by a PFET 1430 whose gate is connected directly to the input 1421 forming a static CMOS circuit, wherein the PFET 1430 and NFET 1425 form a static CMOS inverter. The precharge control signal bPC and the keeper circuit of FIG. 7 are not needed. The sub-circuit with the gated diodes and isolation devices, and the method of operation remain the same as the circuit of FIG. 7.

Figure 15:
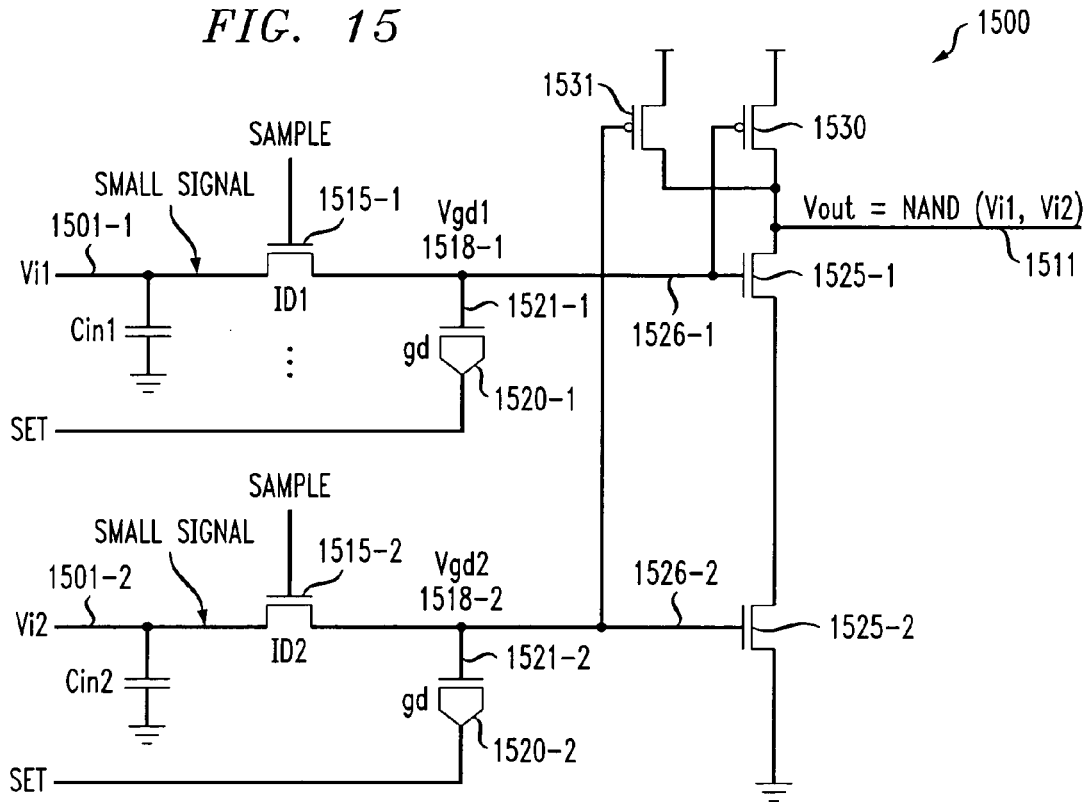
FIG. 15 shows a circuit diagram for a CMOS static version of the 2-input small signal gated diode NAND gate of FIG. 8.

FIG. 15 shows a CMOS static version of the 2-input small signal gated diode NAND gate of FIG. 8. The precharge PFET 830 is replaced by two PFET's 1530 and 1531 whose gates are connected directly to the inputs 1521-1 and 1521-2, respectively, forming a static CMOS circuit, wherein the PFET's 1530, 1531 and NFET's 1525-1, 1525-2 form a static CMOS NAND gate. The precharge control signal bPC and the keeper circuit of FIG. 8 are not needed. The sub-circuit with the gated diodes and isolation devices, and the method of operation remain the same as the circuit of FIG. 8.

For other gated diode logic circuits such as the NOR gate of FIG. 9, the N-input logic circuit of FIG. 10, the N-input logic circuit with footer device of FIG. 11, the N-input, M-output logic circuit with footer device of FIG. 12, the precharge logic circuit portion can be converted into the corresponding static CMOS logic circuit accordingly.

Figure 16:
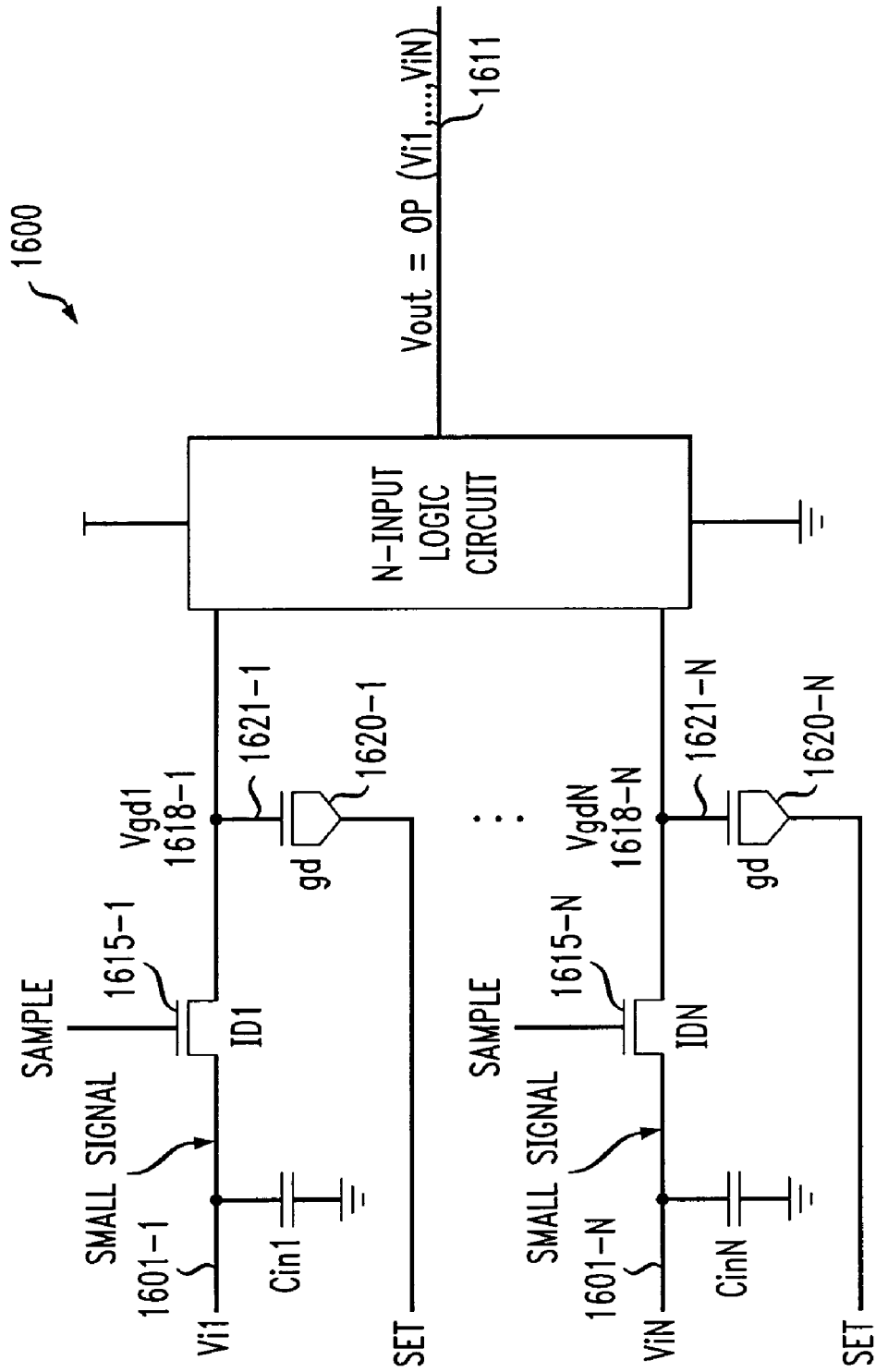
FIG. 16 shows a circuit diagram for an alternative embodiment of an N-input gated diode logic circuit for small signals.

FIG. 16 shows a circuit diagram for an alternative embodiment of the N-input gated diode logic circuit for small signals. The N-input logic circuit is an arbitrary logic circuit such as an N-input static CMOS logic circuit that performs certain predetermined logic functions. The sub-circuit with the gated diodes and isolation devices, and the method of operation remain the same as the circuit of FIG. 10, except that the precharging and the keeper circuit are not required.

Figure 17:
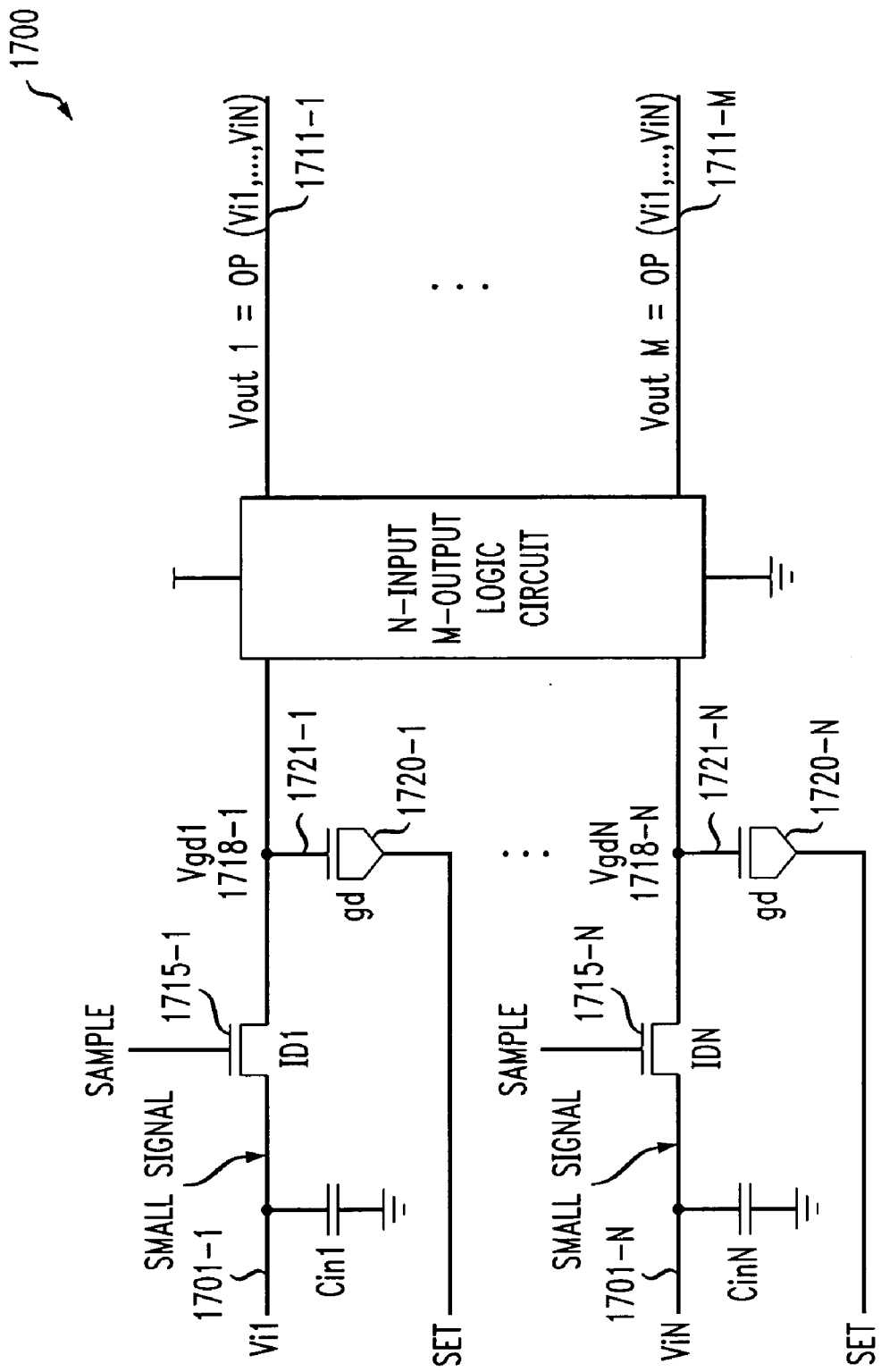
FIG. 17 shows a circuit diagram for an alternative embodiment of an N-input, M-output gated diode logic circuit.

FIG. 17 shows a circuit diagram for an alternative embodiment of the N-input, M-output gated diode logic circuit for small signals. The N-input, M-output logic circuit is an arbitrary logic circuit such as an N-input, M-output static CMOS logic circuit that performs certain predetermined logic functions. The sub-circuit with the gated diodes and isolation devices, and the method of operation remain the same as the circuit of FIG. 12, except that the precharging and the keeper circuit are not required. The optional footer can be added similarly to the N-input, M-output logic circuit as in FIG. 12.

Figure 18:
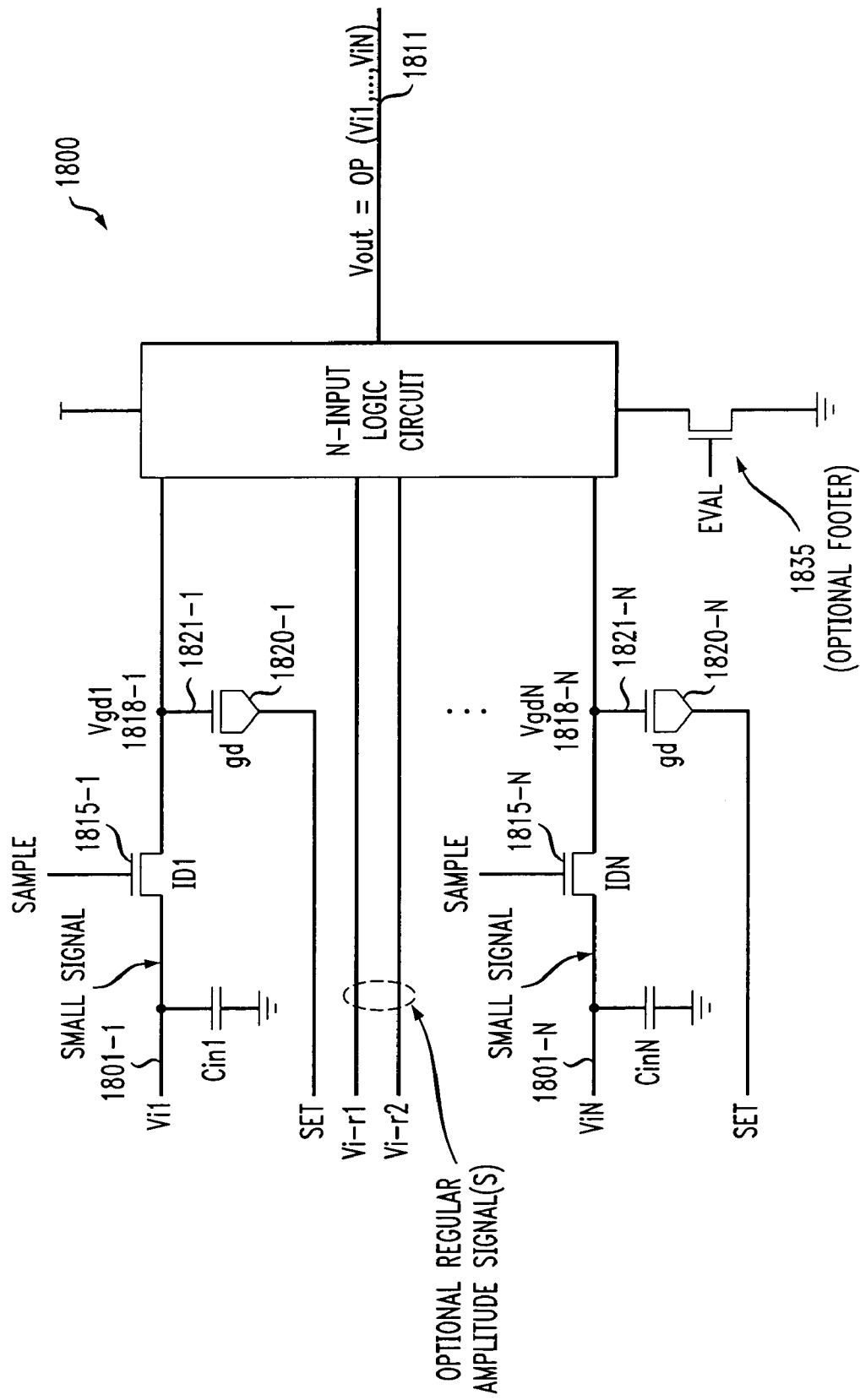
FIG. 18 shows a circuit diagram for an alternative embodiment of an N-input gated diode logic circuit for small signals with an optional footer device and optional inputs for regular amplitude signals.

FIG. 18 shows a circuit diagram for an alternative embodiment of the N-input gated diode logic circuit for small signals with an optional footer device and optional inputs for regular amplitude signals. It is an extension of the N-input gated diode logic circuit of FIG. 16 with an optional footer device added. It also allows regular amplitude signals (Vi-r1, Vi-r2, . . . ) to be directly connected to inputs of the N-input logic circuit, hence enabling the logic operations of an arbitrary number of small signals and regular amplitude signals.

Figure 19:
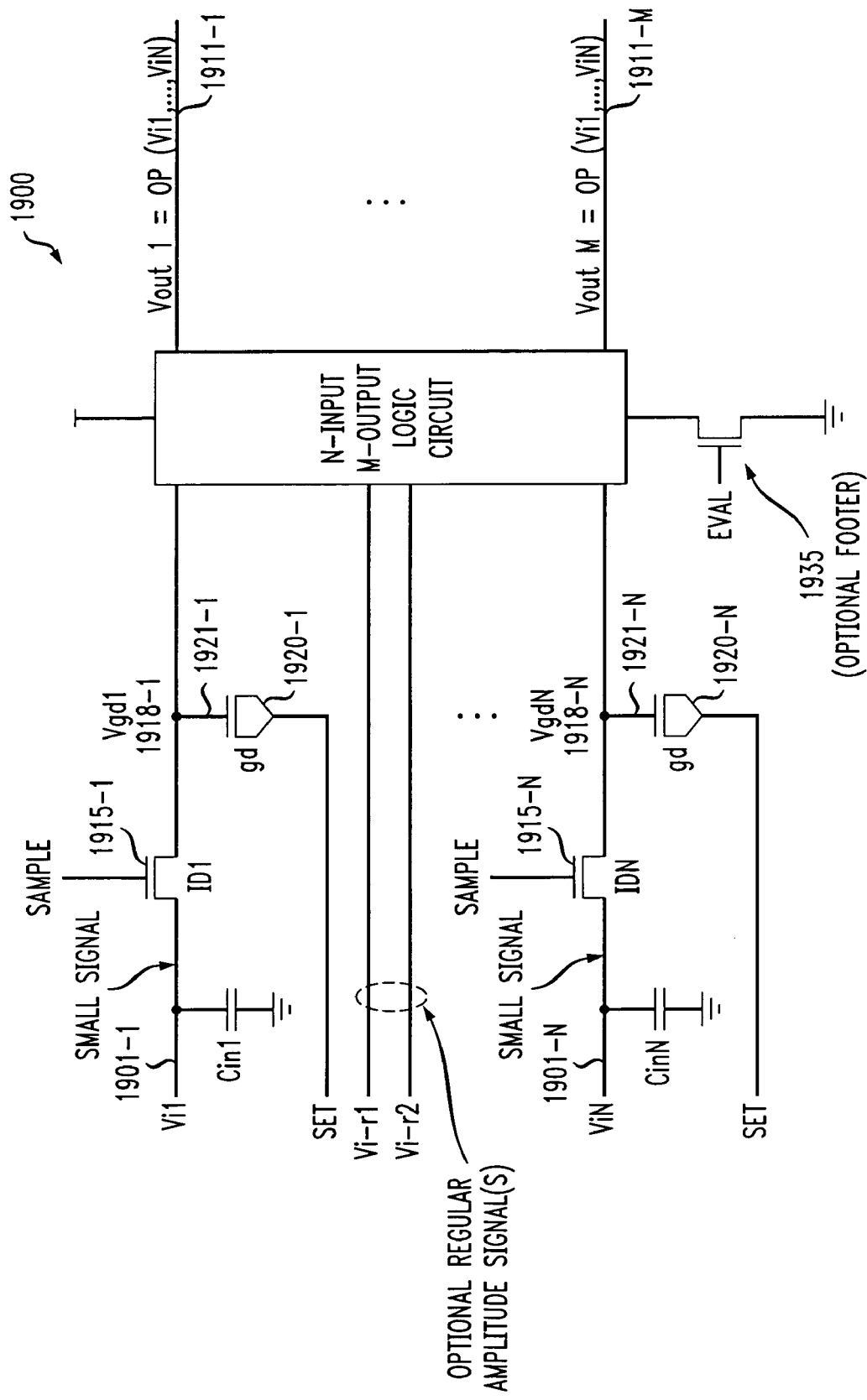
FIG. 19 shows a circuit diagram for an alternative embodiment of an N-input, M-output gated diode logic circuit for small signals with an optional footer device and optional inputs for regular amplitude signals.

FIG. 19 shows a circuit diagram for an alternative embodiment of the N-input, M-output gated diode logic circuit for small signals with an optional footer device and optional inputs for regular amplitude signals. It is an extension of the N-input, M-output gated diode logic circuit of FIG. 17 with an optional footer device added. It also allows regular amplitude signals (Vi-r1, Vi-r2, . . . ) to be directly connected to some inputs of the N-input logic circuit, hence enabling logic operations of an arbitrary number of small signals and regular amplitude signals.

It should be pointed out that the gated diode logic circuits of FIG. 6, FIGS. 8-12, and FIGS. 15-19 can be operated as follows, without explicitly turning the isolation device OFF during the evaluation phase. The control signal SAMPLE connected to the gate of the isolation devices can be a predetermined constant voltage Vx. The magnitude of Vx can be set equal to the sum of the small signal amplitude, the threshold voltage (Vt) of the isolation devices, and a design margin. In this mode of operation, the small signal is allowed to pass through the isolation devices to the gate of the gated diodes. During the evaluation phase, after the SET control signal is raised, the voltages at the gate of the gated diodes (Vgd's) remain low if the corresponding small signal inputs are 0-data, and the voltages at the gate of the gated diodes (Vgd's) rise high and turn OFF the isolation devices if the corresponding small signal inputs are 1-data. At the end of the evaluation phase, the SET signal is returned to a low level to complete the operation.

It is to be understood that the embodiments and variations shown and described herein are merely illustrative of the principles of this invention and that various modifications may be implemented by those skilled in the art without departing from the scope and spirit of the invention.

I claim:

1. A gated diode logic circuit comprising:
   two or more gated diodes, two or more isolation devices, and a logic circuit, wherein each gate of said two or more gated diodes is connected to an input of said logic circuit and is connected to a first port of one of said two or more isolation devices.

2. The gated diode logic circuit of claim 1, wherein each of two or more small amplitude signals are connected to a second port of one of said two or more isolation devices and wherein each of said two or more small amplitude signals can be sensed and amplified by changing a voltage of a source of said two or more gated diodes in an evaluation mode.

3. The gated diode logic circuit of claim 2, wherein at least two of said two or more isolation devices passes at least two of said two or more small amplitude signals to at least two of said two or more gates in a sampling mode and isolates said small amplitude signals from said gates in said evaluation mode.

4. The gated diode logic circuit of claim 2, further comprising a first transistor, wherein said first transistor of said gated diode logic circuit performs one of the following: precharges an output to a logic high level or pulls up an output to a logic high level.

5. The gated diode logic circuit of claim 4, further comprising a footer device connected in series between ground and current paths of said first transistor, wherein said footer device limits leakage current between ground and a voltage source.

6. The gated diode logic circuit of claim 4, further comprising a second transistor for each of said two or more gated diodes, wherein each second transistor is connected in series with said first transistor and wherein a gate of each second transistor is connected to one gate of said two or more gated diodes.

7. The gated diode logic circuit of claim 1, wherein a threshold voltage of said two or more gated diodes is at a voltage between a low level small signal voltage and a high level small signal voltage.

8. The gated diode logic circuit of claim 1, further comprising a keeper circuit to latch an output of said gated diode logic circuit.

9. The gated diode logic circuit of claim 1, wherein said isolation device is a field-effect transistor and wherein a gate of said isolation device is set at a predefined voltage.

10. A method for performing logic operations on two or more small amplitude signals, comprising the steps of:
    applying each of at least two of said two or more small amplitude signals to a corresponding gate of two or more gated diodes in a sampling mode;
    isolating said at least two of said two or more small amplitude signals from said gates of said two or more gated diodes in an evaluation mode;
    changing a voltage level of a source of said at least two of said two or more gated diodes to boost two or more signals on said at least two gates of said two or more gated diodes; and performing a logic operation on said two or more boosted signals.

11. An integrated circuit, comprising:
one or more gated diodes, wherein one or more small amplitude signals can be sensed and amplified by applying said small amplitude signal to a gate of one of said one or more gated diodes in a sampling mode and changing a voltage of a source of one of said one or more gated diodes in an evaluation mode.

12. The integrated circuit of claim 11, further comprising one or more isolation devices, wherein each of said one or more isolation devices is connected between one of said one or more small amplitude signals and one gate of one of said one or more gated diodes.

13. The integrated circuit of claim 12, wherein said isolation device passes said small amplitude signal to said gate in said sampling mode and isolates said small amplitude signal from said gate of said gated diode in said evaluation mode.

14. The integrated circuit of claim 12, further comprising one or more logic circuits, each of said one or more logic circuits comprising one or more logic circuit ports, wherein at least one of said logic circuit ports receives a signal from one gate of said one or more gated diodes.

15. The integrated circuit of claim 12, further comprising a first transistor, wherein said first transistor of said gated diode logic circuit performs one of the following: precharges an output to a logic high level or pulls up an output to a logic high level.

16. The integrated circuit of claim 15, further comprising a footer device connected in series between ground and current paths of said first transistor, wherein said footer device limits leakage current between ground and a voltage source.

17. The integrated circuit of claim 15, further comprising a second transistor for each of said one or more gated diodes, wherein each second transistor is connected in series with said first transistor and wherein a gate of each second transistor is connected to one gate of said one or more gated diodes.

18. The integrated circuit of claim 12, wherein a threshold voltage of said one or more gated diodes is at a voltage between a low level small signal voltage and a high level small signal voltage.

19. The integrated circuit of claim 12, further comprising a keeper circuit to latch an output of said integrated circuit.

20. The gated diode logic circuit of claim 12, wherein said isolation device is a field-effect transistor and wherein a gate of said isolation device is set at a predefined voltage.

* * * * *